(12) United States Patent
Wang et al.

(10) Patent No.: US 11,973,474 B2
(45) Date of Patent: Apr. 30, 2024

(54) POWER AMPLIFIERS AND TRANSMISSION SYSTEMS AND METHODS OF BROADBAND AND EFFICIENT OPERATIONS

(71) Applicant: Georgia Tech Research Corporation, Atlanta, GA (US)

(72) Inventors: Fei Wang, Atlanta, GA (US); Hua Wang, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 140 days.

(21) Appl. No.: 17/605,440

(22) PCT Filed: Apr. 20, 2020

(86) PCT No.: PCT/US2020/029303
§ 371 (c)(1),
(2) Date: Oct. 21, 2021

(87) PCT Pub. No.: WO2020/219534
PCT Pub. Date: Oct. 29, 2020

(65) Prior Publication Data
US 2022/0200543 A1    Jun. 23, 2022

Related U.S. Application Data

(60) Provisional application No. 62/839,619, filed on Apr. 27, 2019, provisional application No. 62/836,781, filed on Apr. 22, 2019.

(51) Int. Cl.
H04B 1/00    (2006.01)
H03F 1/14    (2006.01)
(Continued)

(52) U.S. Cl.
CPC ............ *H03F 1/565* (2013.01); *H03F 3/245* (2013.01); *H04B 1/0053* (2013.01);
(Continued)

(58) Field of Classification Search
None
See application file for complete search history.

(56) References Cited

U.S. PATENT DOCUMENTS

7,167,378 B2    1/2007    Yamada
7,821,339 B1    10/2010   Afsahi
(Continued)

OTHER PUBLICATIONS

International Search Report and Written Opinion from Application No. PCT/US2020/029303 dated Oct. 5, 2020.

*Primary Examiner* — Pablo N Tran
(74) *Attorney, Agent, or Firm* — Troutman Pepper Hamilton Sanders LLP; Ryan A. Schneider; Haden R. Marrs

(57) ABSTRACT

The disclosed technology includes device, systems, techniques, and methods for amplifying a complex modulated signal with a broadband power amplifier. A broadband power amplifier may include an input network connected a long an input signal path, a driver stage, an interstage matching network stage, a power amplification stage, and a broadband matching output network. The broadband matching output network may include two coupled transmission lines and a compensation line connected between the two coupled transmission lines. Further, the broadband matching output network may include a capacitor connected with a secondary winding and a capacitor connected to each of the primary windings. The disclosed technology further includes transmission systems incorporating the broadband power amplifier.

20 Claims, 21 Drawing Sheets

(51) Int. Cl.
*H03F 1/56* (2006.01)
*H03F 3/24* (2006.01)
*H04B 1/04* (2006.01)

(52) U.S. Cl.
CPC ....... *H04B 1/0458* (2013.01); *H03F 2200/06* (2013.01); *H03F 2200/222* (2013.01); *H03F 2200/387* (2013.01); *H03F 2200/451* (2013.01)

(56) References Cited

U.S. PATENT DOCUMENTS

| | | | |
|---|---|---|---|
| 8,149,050 B2* | 4/2012 | Cabanillas | H03F 3/72 |
| | | | 330/51 |
| 9,431,975 B2 | 8/2016 | Chakrabarti et al. | |
| 9,654,066 B2 | 5/2017 | Leong et al. | |
| 9,685,915 B2 | 6/2017 | Blednov | |
| 9,859,844 B1* | 1/2018 | Amiot | H03F 3/26 |
| 11,283,474 B2* | 3/2022 | Shen | H03F 3/24 |
| 2006/0155270 A1* | 7/2006 | Hancock | H05B 6/705 |
| | | | 607/101 |
| 2008/0238573 A1 | 10/2008 | Yamazaki | |
| 2009/0273397 A1* | 11/2009 | Bockelman | H03F 1/0277 |
| | | | 330/195 |
| 2010/0225388 A1* | 9/2010 | Miyashita | H03F 1/0288 |
| | | | 330/124 R |
| 2011/0037516 A1 | 2/2011 | Nejati et al. | |
| 2019/0007480 A1 | 3/2019 | Qatar | |
| 2022/0247360 A1* | 8/2022 | Hampel | H03F 3/602 |
| 2022/0360231 A1* | 11/2022 | Tanio | H03F 1/223 |
| 2023/0134681 A1* | 5/2023 | Outaleb | H01Q 3/36 |
| | | | 342/372 |

* cited by examiner

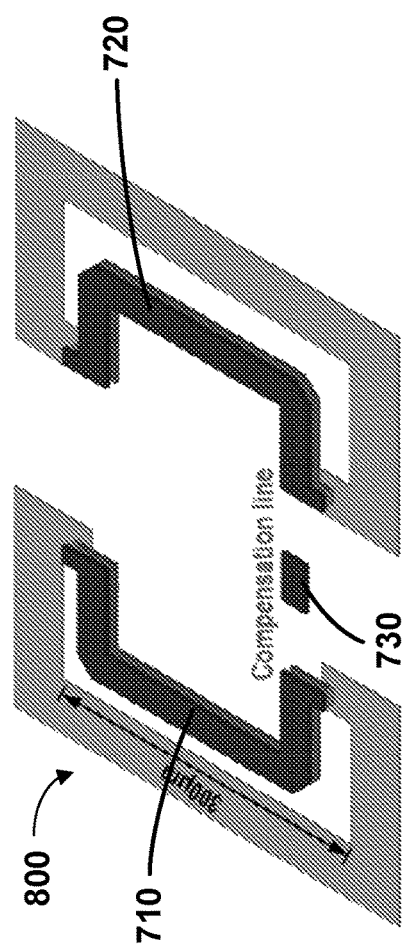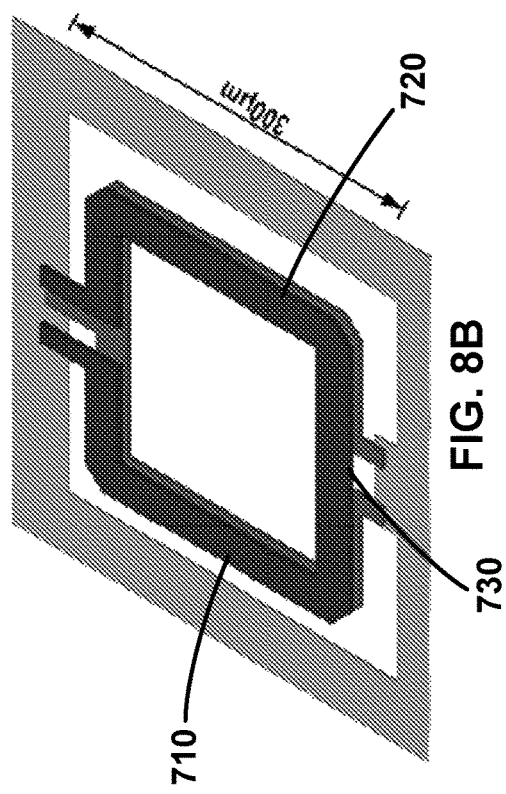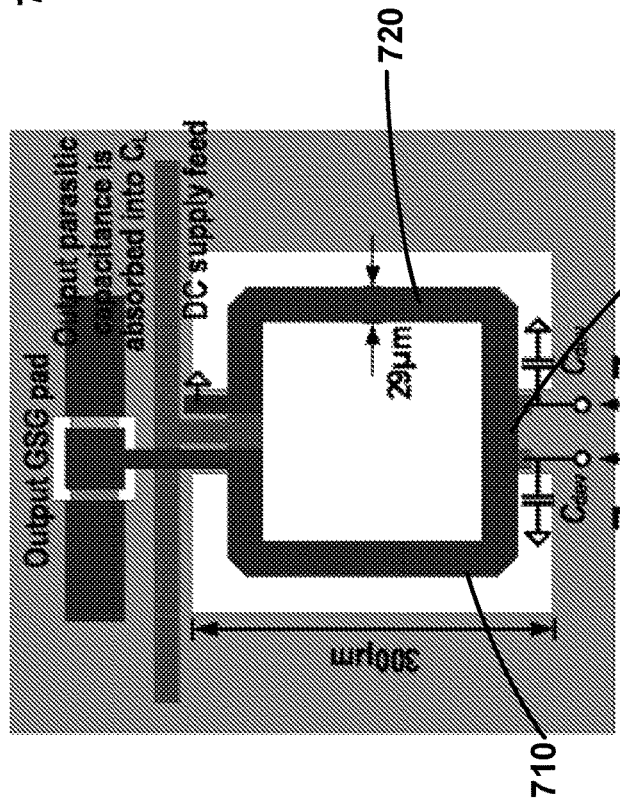
FIG. 8A
FIG. 8B
FIG. 8C

POWER AMPLIFIERS AND TRANSMISSION SYSTEMS AND METHODS OF BROADBAND AND EFFICIENT OPERATIONS

CROSS-REFERENCE TO RELATED APPLICATIONS

This application claims priority to, and the benefit under 35 U.S.C. § 119(e), of U.S. Provisional Patent Application No. 62/836,781, filed 22 Apr. 2019, the entire contents and substance of which are hereby incorporated by reference as if fully set forth below, and of U.S. Provisional Patent Application No. 62/839,619, filed 27 Apr. 2019, the entire contents and substance of which are hereby incorporated by reference as if fully set forth below.

FIELD OF INVENTION

Examples of the present disclosure relate to broadband, or mm-wave, power amplifiers and transmission systems and methods of operating the same, and more particularly to high-efficiency instantaneous broadband mm-wave power amplifiers that cover multiple high-frequency bands including a compact low-loss broadband matching network.

BACKGROUND

With the explosive growth of mobile traffic demand, the contradiction between capacity requirements and spectrum shortage becomes increasingly prominent. The fifth generation (5G) of wireless networks will have to address this problem. An increasingly popular solution is to incorporate the millimeter wave (mmWave) band, which runs from 30 GHz to 300 GHz, into these 5G networks. While the huge bandwidth in the mmWave would allow for accommodation of more mobile traffic, fundamental differences between current systems operating in the microwave band, which runs from 2.4 GHz to 5 GHz, introduce new problems such as high propagation loss, directivity, sensitivity to blockage, and dynamics due to mobility of mmWave communications. In parallel, there is also a rapidly increasing demand on higher data rate for the communication systems in existing GHz frequency regime. All these challenges require new thoughts and insights in architectures and protocols.

The power amplifier (PA) serves as the interface between the radio frequency (RF) transmitter system and the antenna and is often considered one of the most critical building blocks in a wireless network. Due to the PAs effects on the efficiency and linearity of a network, they will play a critical role in the future wireless communication networks operating at the mmWave bands as well as the GHz bands. Conventional wideband power-amplifier (PA) architectures often suffer from various limitations. For example, balanced PAs require wideband 90° hybrids that are often bulky and lossy for on-chip implementation. Additionally, staggered tuning sacrifices PA gain and output power (Pout). High-order matching networks are also popularly used for wideband PA architectures, but typically require large, bulky form factors and exhibit poor passive efficiency.

Additionally, while transformers are extensively used in wideband PA architectures, such architectures tend to be very complex making it very challenging to model various frequency-dependent behaviors/parasitics, thus making it challenging to accurately guide wideband PA architecture designs. As a result, the manufactured device structures often differ from the models, thus compromising the broadband performance. For example, most reported wideband PAs only support wideband gain or output power when the amplifier is saturated, but not output power when the amplifier is at the 1 dB compression point Therefore, there exists the need for a new wideband PA architecture that can achieve instantaneous mm-wave coverage across 5G bands with decreased complexity and increased efficiency, in order to enable the next generation wireless communication systems.

SUMMARY

Some or all of the above deficiencies may be addressed by certain embodiments of the disclosed technology. Disclosed embodiments provide mixed-signal power amplification systems and methods.

An exemplary embodiment provides a mm-wave power amplifier comprising an input network connected an input signal path, a driver stage, an interstage matching network stage, a power amplification stage, and a broadband matching output network. The broadband matching output network comprising two coupled transmission lines, and a compensation line connected between the two coupled transmission lines.

In any of the embodiments disclosed herein, the broadband matching output network further comprises a capacitor connected with a secondary winding and a capacitor connected to each of the primary windings.

In any of the embodiments disclosed herein, the broadband matching output network further comprises a transmission line connected with a secondary winding and a capacitor connected to each of the primary windings.

In any of the embodiments disclosed herein, the input network comprises an input balun.

In any of the embodiments disclosed herein, the mm-wave power amplifier is configured to provide instantaneous 24 GHz, 28 GHz, 33 GHz, 37 GHz, 39 GHz, and 42 GHz operations.

In any of the embodiments disclosed herein, the mm-wave power amplifier is configured to provide 1 dB power gain bandwidth across a spectrum of 24 GHz to 42 GHz.

In any of the embodiments disclosed herein, the power amplification stage comprises a cascode power amplification stage.

In any of the embodiments disclosed herein, the power amplification stage further comprises a common-source driver stage.

In any of the embodiments disclosed herein, the two coupled transmission lines are meandered and merged with the compensation line.

In any of the embodiments disclosed herein, the mm-wave power amplifier is fabricated as a 45 nm silicon-on-insulator complementary metal-oxide-semiconductor.

Another embodiment provides a transmission system comprising a radio transmitter system for outputting a complex modulated signal, an mm-wave power amplifier for receiving the complex modulated signal and outputting an amplified output signal, and an antenna for transmitting the amplified output signal. The mm-wave power amplifier comprising an input network connected a long an input signal path, a driver stage, an interstage matching network stage, a power amplification stage, and a broadband matching output network comprising. The broadband matching output network comprising two coupled transmission lines.

In any of the embodiments disclosed herein, the broadband matching output network further comprises a capacitor connected with a secondary winding and a capacitor connected to each of the primary windings.

In any of the embodiments disclosed herein, the broadband matching output network further comprises an transmission line connected with a secondary winding and a capacitor connected to each of the primary windings.

In any of the embodiments disclosed herein, the input network comprises an input balun.

In any of the embodiments disclosed herein, the mmwave power amplifier is configured to provide instantaneous 24 GHz, 28 GHz, 33 GHz, 37 GHz, 39 GHz, and 42 GHz operations.

In any of the embodiments disclosed herein, the mmwave power amplifier is configured to provide 1 dB power gain bandwidth across a spectrum of 24 GHz to 42 GHz.

In any of the embodiments disclosed herein, the power amplification stage comprises a cascode power amplification stage.

In any of the embodiments disclosed herein, the power amplification stage further comprises a common-source driver stage.

In any of the embodiments disclosed herein, the two coupled transmission lines are meandered and merged with the compensation line.

In any of the embodiments disclosed herein, the mmwave power amplifier is fabricated as a 45 nm silicon-on-insulator complementary metal-oxide-semiconductor.

Another embodiment provides an active load modulation power amplifier comprising an input network connected along an input signal path, a driver stage, an interstage matching network stage, a main power amplification stage, a first auxiliary power amplification stage, a second auxiliary power amplification stage, and a hybrid coupler output network. The hybrid coupler output network comprising a quadrature coupling having a load is connected to the input port and the main power amplification stage, the first auxiliary power amplification stage, and the second auxiliary power amplification stage connected to the remaining ports.

In any of the embodiments disclosed herein, the active load modulation power amplifier has efficiency peaks at 0 dB back-off, 6 dB back-off and 12 dB back-off.

In any of the embodiments disclosed herein, the first auxiliary power amplification stage and the second auxiliary power amplification stage are off at less than −12 dB back-off.

In any of the embodiments disclosed herein, the first auxiliary power amplification stage turns on at −12 dB back-off.

In any of the embodiments disclosed herein, the second auxiliary power amplification stage turns on at −6 dB back-off.

In any of the embodiments disclosed herein, the main power amplification stage, the first auxiliary power amplification stage, and the second auxiliary power amplification stage each comprise class-B amplifiers.

Other embodiments, features, and aspects of the disclosed technology are described in detail herein and are considered a part of the claimed disclosed technology. Other embodiments, features, and aspects can be understood with reference to the following detailed description, accompanying drawings, and claims.

BRIEF DESCRIPTION OF THE FIGURES

Reference will now be made to the accompanying figures and flow diagrams, which are not necessarily drawn to scale, and wherein:

FIGS. 8A-8C depicts a block diagram of the design process of example output network of a broadband power amplifier, in accordance with an example of the present disclosure.

Figure 2:
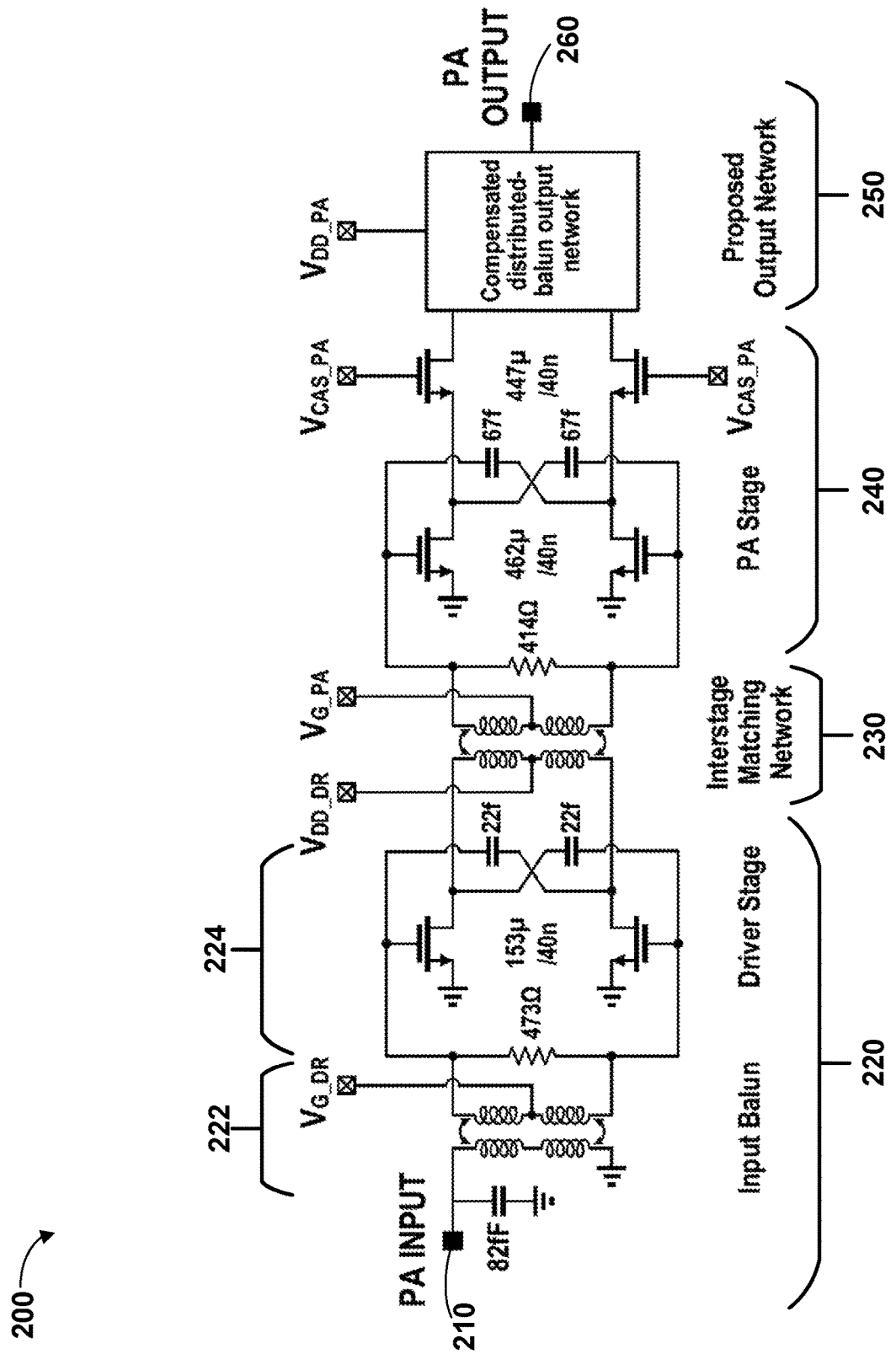
FIG. 2 is a circuit diagram of a broadband power amplifier, in accordance with an example of the present disclosure.

QAM signals applied to example broadband amplifier 200 of FIG. 2, in accordance with an example of the present disclosure.

Figure 18:
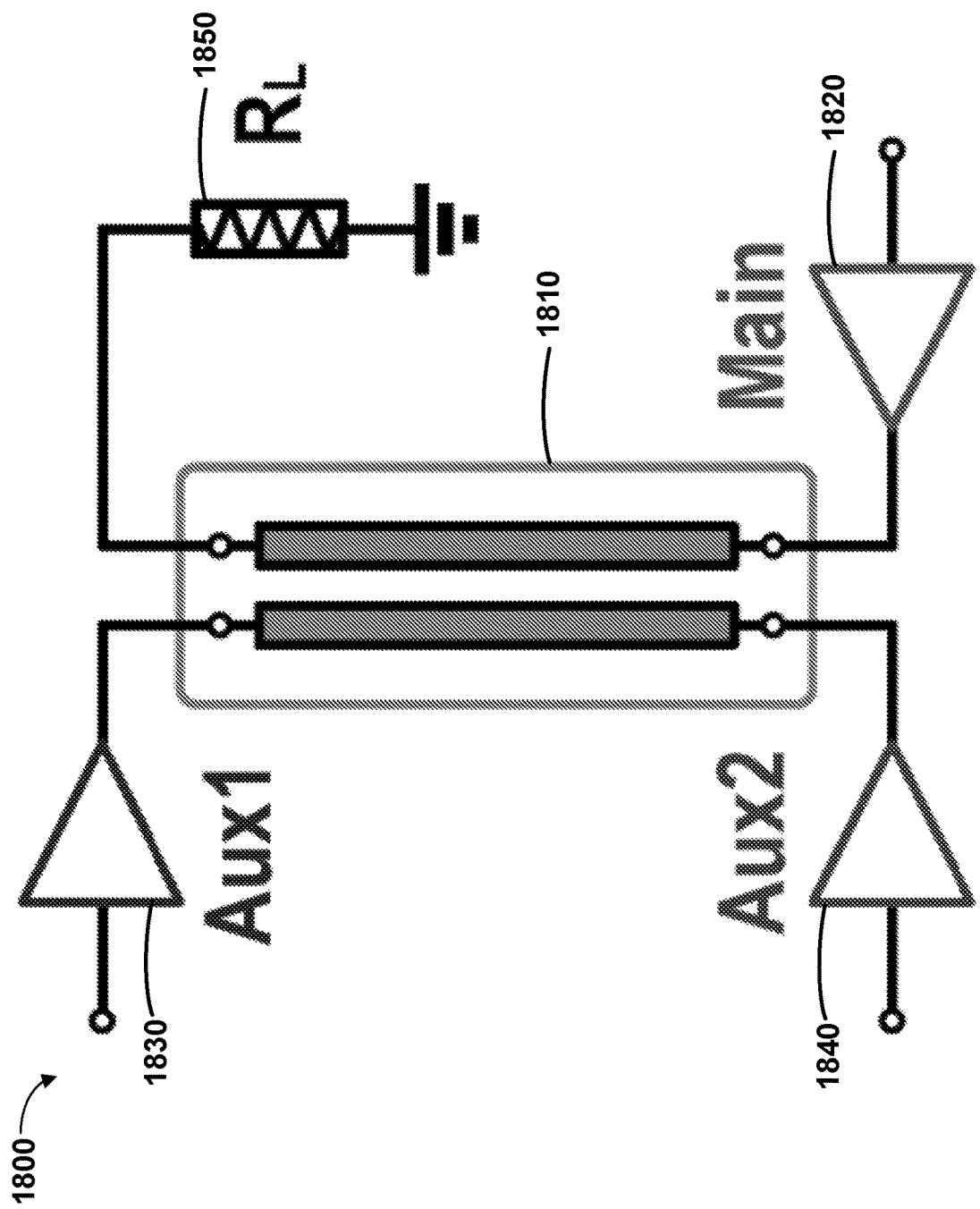

FIG. 18 depicts a block diagram of an example output network of an active load modulation power amplifier with multiple efficiency peaks at back-off, in accordance with an example of the present disclosure.

Figure 19:
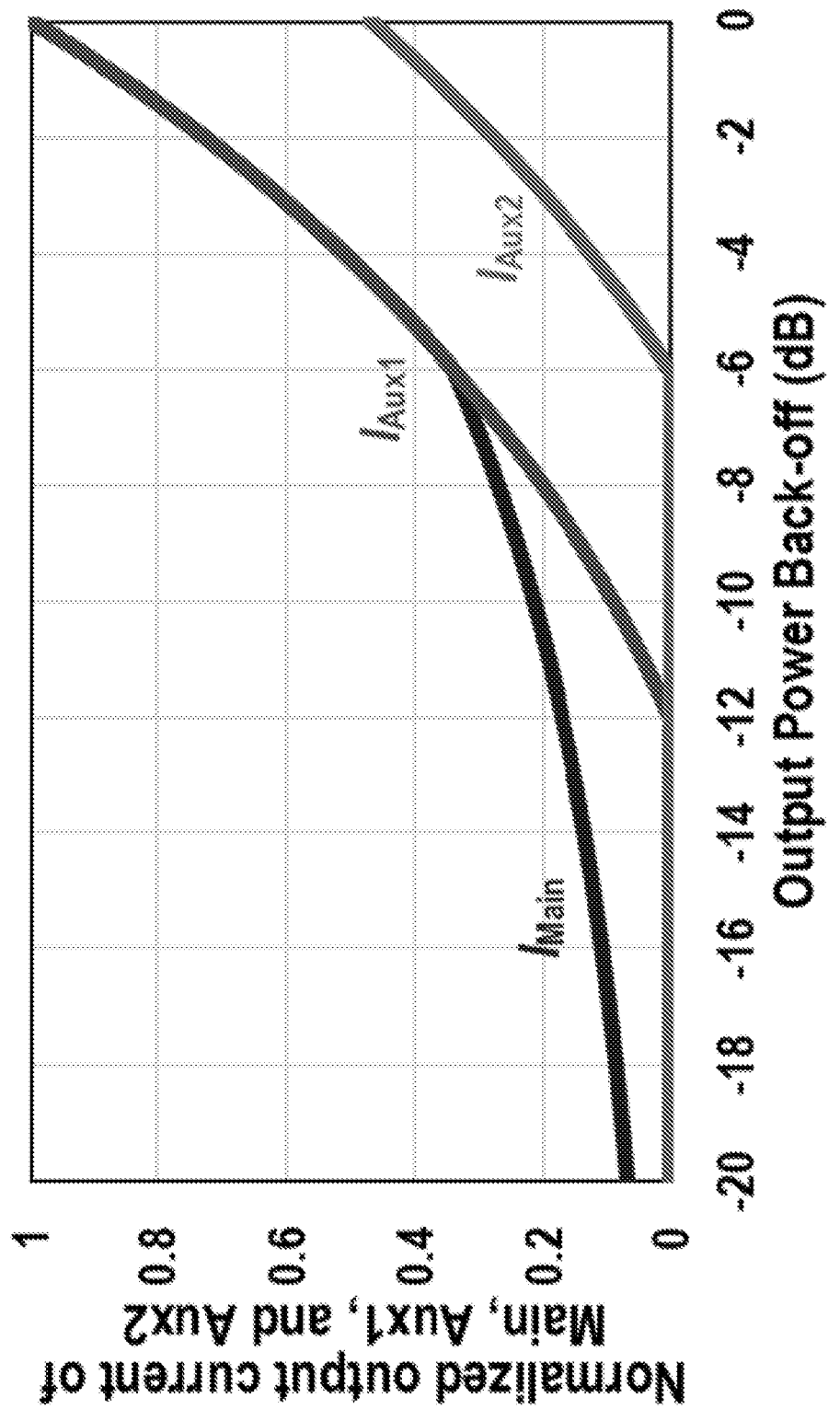

FIG. 19 is a chart depicting the output current versus output power back-off of the example output network of FIG. 18, in accordance with an example of the present disclosure.

Figure 20:
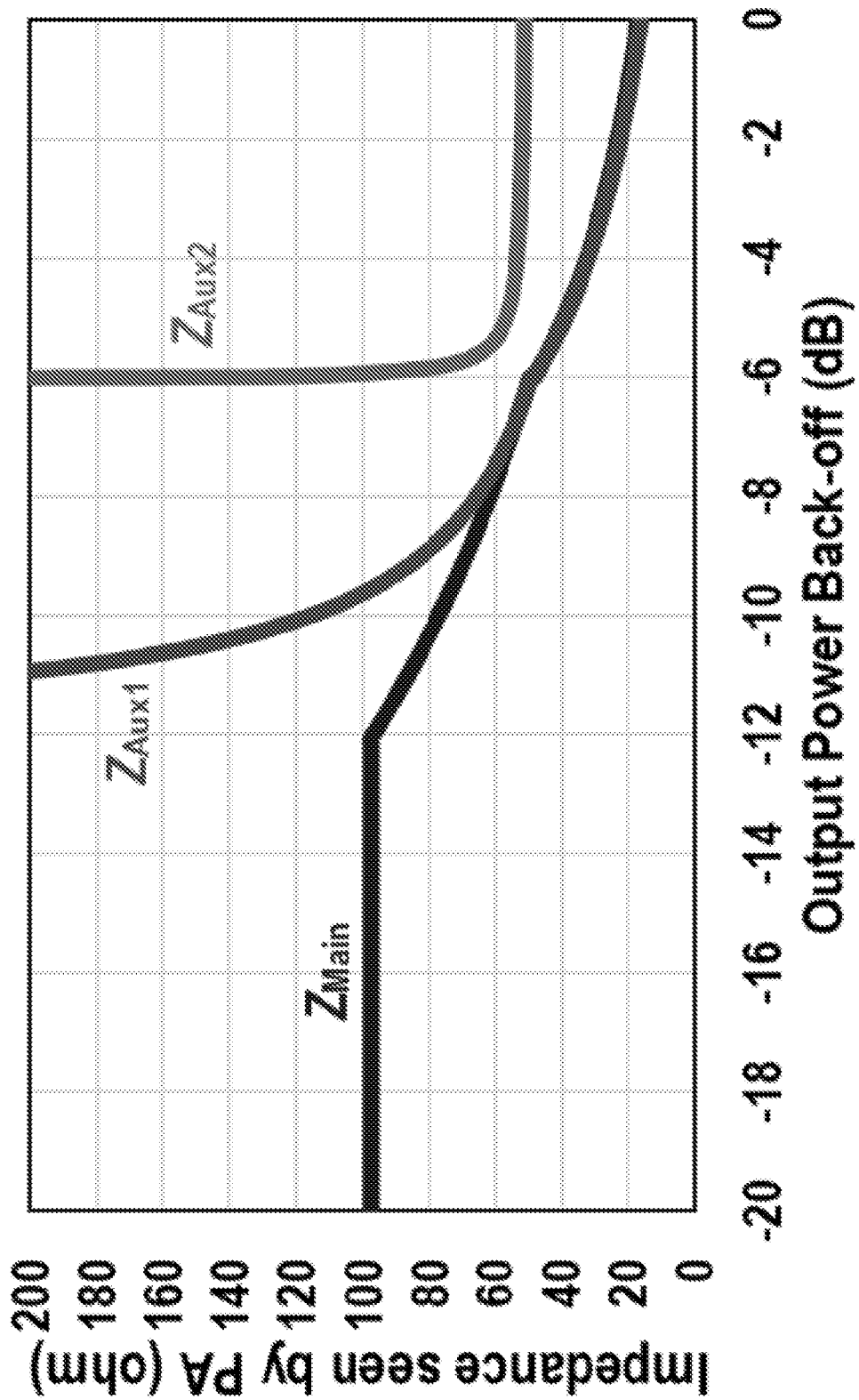

FIG. 20 is a chart depicting the impedance versus output power back-off of the example output network of FIG. 18, in accordance with an example of the present disclosure.

Figure 21:
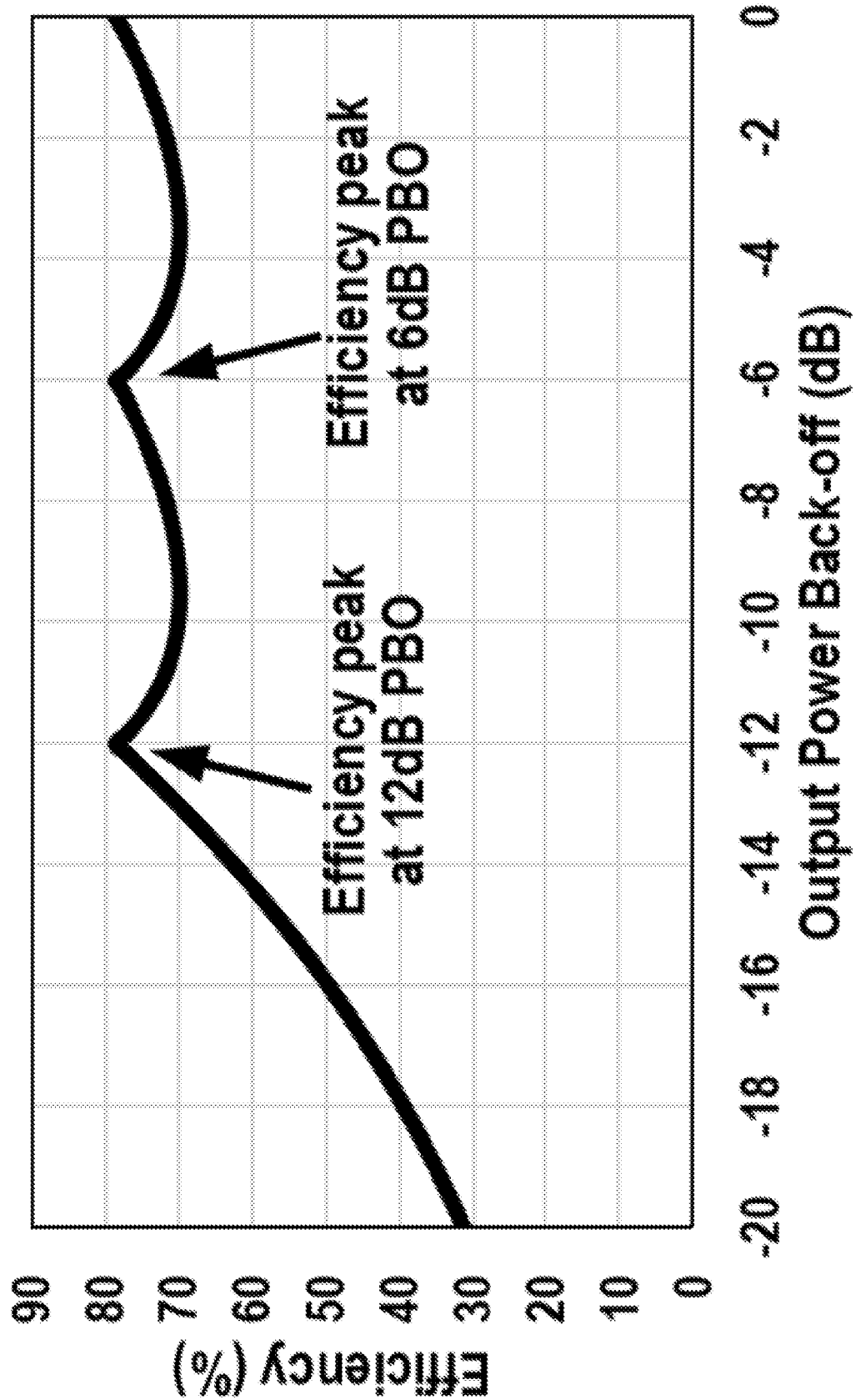

FIG. 21 is a chart depicting the efficiency back-off curve of the example output network of FIG. 18, in accordance with an example of the present disclosure.

DETAILED DESCRIPTION

As described herein, embodiments of the disclosed technology include broadband, or mm-wave, power amplifiers and transmission systems and methods of operating the same, and more particularly to high-efficiency instantaneous broadband mm-wave power amplifiers that cover multiple high-frequency bands including a compact low-loss broadband matching network. The low-loss broadband matching network incorporates a coupled transmission line transformer. As will be appreciated such a design provides the benefits of differential-single-ended conversion, impedance matching/transformation, decoupling of signal path and biasing paths, simple DC biasing, and a small form factor. Further, the simplification of the circuit parameters further allows for support of complex modulations with large modulation bandwidths from hundreds of MHz to even GHz range.

Such characteristics and advantages make broadband power amplifiers and devices that incorporate them ideal candidates for inclusion in next generation wireless communication systems to address the rising demand for mobile traffic, such as $5^{th}$ generation (5G) communication, which will likely incorporate high speed modulation and mmWave band carriers running from 20 GHz to 300 GHz. The 24 GHz, 28 GHz, 33 GHz, 37 GHz, 39 GHz and 42 GHz bands are specific bands that will likely play a role in future 5G communications devices. While such bands offer the benefit of increased data capacity, they also pose significant challenges for communication systems such as high propagation loss, directivity, sensitivity to blockage, and dynamics due to mobility of mmWave communications. Specifically, the high peak efficiency, large dynamic range, and support of complex GHz modulation afforded by the proposed broadband power amplifier make it well suited to overcome the challenges of mmWaves. In a certain embodiment of the present invention, a broadband mm-Wave mixed-signal transmitter system that can support multiple GHz bands (24 GHz, 28 GHz, 33 GHz, 37 GHz, 39 GHz and 42 GHz) for 5G MIMO communication is presented.

Throughout this disclosure, certain embodiments are described in exemplary fashion in relation to a broadband, linear, and efficient transmitter system. However, embodiments of the disclosed technology are not so limited. In some embodiments, the disclosed technique may be effective in mmWave communication and radar applications. Moreover, embodiments of the disclosed technique may be used in a variety of communication devices, such as smart phones, tablets, 5G MIMO systems such as mobile handsets and base-station units, devices employing Internet-of-Things technology such as nest thermostats, connected appliances, devices associated with emerging applications such as augmented reality (AR), virtual reality (VR), and mixed reality (MR), and other similar devices.

Some implementations of the disclosed technology will be described more fully with reference to the accompanying drawings. This disclosed technology, however, may be embodied in many different forms and should not be construed as limited to the implementations set forth herein. The components described hereinafter as making up various elements of the disclosed technology are intended to be illustrative and not restrictive. Many suitable components that could perform the same or similar functions as components described herein are intended to be embraced within the scope of the disclosed systems and methods. Such other components not described herein may include, but are not limited to, for example, components developed after development of the disclosed technology.

It is also to be understood that the mention of one or more method steps does not imply a particular order of operation or preclude the presence of additional method steps or intervening method steps between those steps expressly identified. Similarly, it is also to be understood that the mention of one or more components in a device or system does not preclude the presence of additional components or intervening components between those components expressly identified.

Reference will now be made in detail to examples of the disclosed technology, examples of which are illustrated in the accompanying drawings and disclosed herein. Wherever convenient, the same references numbers will be used throughout the drawings to refer to the same or like parts.

Figure 1:
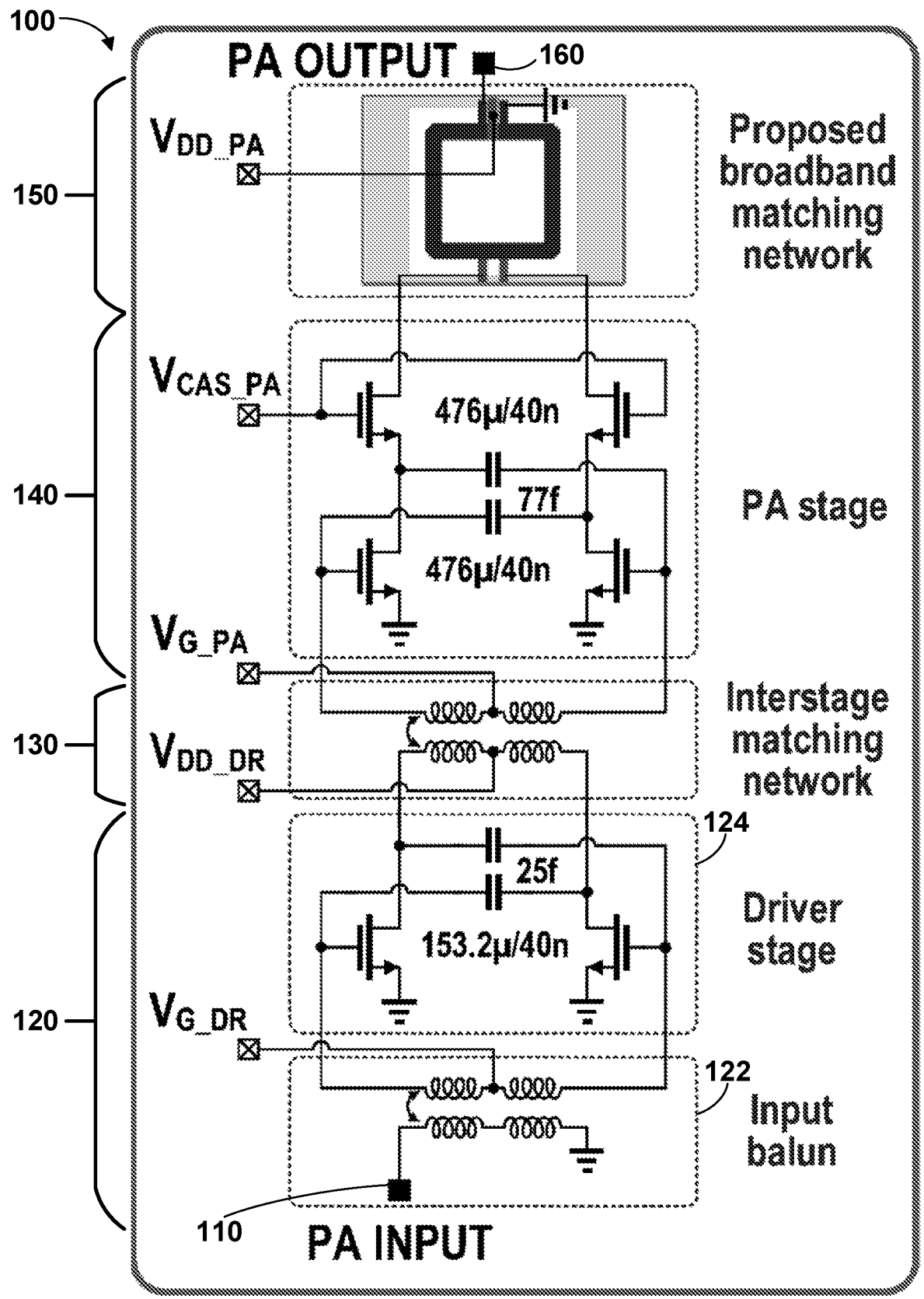
FIG. 1 depicts a block diagram of a broadband power amplifier, in accordance with an example of the present disclosure.

FIG. 1 depicts a block diagram of a broadband power amplifier 100, in accordance with an example of the present disclosure. A broadband power amplifier 100 of FIG. 1 may be used to receive an input signal 110, amplify the signal, and produce an output signal 160 having amplified power. As shown, the broadband power amplifier 100 may include an input network 120, an interstage matching network 130, a power amplification stage 140, and a broadband matching output network 150. As further depicted, the input network 120 can include an input balun 122 and a driver stage 124. The input balun 122 can match the input impedance to the impedance of the device that provides the input signal 110 and send an impedance matched signal to the driver stage 124. The driver stage 124 can amplify the signal from the input balun 122 and send a first amplified signal to the interstage matching network 130. The interstage matching network 130 can match the impedance of the first amplified signal and send an impedance matched signal to the power amplification stage 140 that can generate a second amplified signal. The broadband matching output network 150 can match the output impedance of the power amplification stage 140 and produce an output signal 160.

The input balun 122 can be made of passive components such as inductors and capacitors that match the impedance to the driver input impedance and then outputs the signal to the driver stage 124. The driver stage 124 can be made from power cells/transistors that are configured to amplify the signal and then output the signal to the interstage matching network 130. The interstage matching network 130 can be made from passive components such as inductors and capacitors that are configured to match the power amplification input impedance to the desired driver load impedance before outputting a signal the power amplification stage 140.

The power amplification stage 140 can be configured to amplify an RF signal and provide an amplified RF signal. The power amplification stage 140 can include any suitable RF power amplifier transistor. For instance, the power amplification stage 140 can be implemented by one or more bipolar transistors, such as one or more SiGe bipolar transistors or one or more GaAs heterojunction bipolar transistors (HBTs). The power amplification stage 140 can be activated and deactivated as desired. For instance, a power amplifier bias signal provided to the power amplification stage 140 can deactivate the power amplification stage 140 when the amplified RF signal provided by the power amplification stage 140 is not being used. Additionally, the power amplification stage 140 can be an extracted cascode stage.

The broadband matching output network 150, as depicted and further discussed with respect to FIGS. 4-9B, can include a distributed balun. For example, broadband matching output network 150 can include coupled transmission lines. The broadband matching output network 150 can include two coupled lines, a capacitor ($C_L$) at the secondary winding, and respective capacitors ($C_{dev}$) at the primary windings. As will be appreciated such a design is configured to absorb the device output capacitances. Additionally, broadband matching output network 150 can include a compensation line connected between the two coupled transmission lines. As will be appreciated, such a design will reduce impedance imbalances across different ports of the broadband matching output network 150.

FIG. 2 depicts a circuit diagram of a broadband power amplifier 200, in accordance with an example of the present disclosure. A broadband power amplifier 200 of FIG. 2 may be used to receive an input signal 210, amplify the signal, and produce an output signal 260 having amplified power. As shown, the broadband power amplifier 200 may include an input network 220, an interstage matching network 230, a power amplification stage 240, and a compensated distributed-balun output network 250. As further depicted, the input network 220 can include an input balun 222 and a driver stage 224. The input balun 222 can match the input impedance to the impedance of the device that provides the input signal 210 and send an impedance matched signal to the driver stage 224. The driver stage 224 can amplify the signal from the input balun 222 and send a first amplified signal to the interstage matching network 230. The interstage matching network 230 can match the impedance of the first amplified signal and send an impedance matched signal to the power amplification stage 240 that can generate a second amplified signal. The compensated distributed-balun output network 250 can match the output impedance of the power amplification stage 240 and produce an output signal 260.

The input balun 222 can be made of passive components such as inductors and capacitors that match the impedance to the driver input impedance and then outputs the signal to the driver stage 224. The driver stage 224 can be made from power cells/transistors that are configured to amplify the signal and then output the signal to the interstage matching network 230. The interstage matching network 230 can be made from passive components such as inductors and capacitors that are configured to match the power amplification input impedance to the desired driver load impedance before outputting a signal the power amplification stage 240.

The power amplification stage 240 can be configured to amplify an RF signal and provide an amplified RF signal. The power amplification stage 240 can include any suitable RF power amplifier transistor. For instance, the power amplification stage 240 can be implemented by one or more bipolar transistors, such as one or more SiGe bipolar transistors or one or more GaAs heterojunction bipolar transistors (HBTs). The power amplification stage 240 can be activated and deactivated as desired. For instance, a power amplifier bias signal provided to the power amplification stage 240 can deactivate the power amplification stage 240 when the amplified RF signal provided by the power amplification stage 240 is not being used. Additionally, the power amplification stage 240 can be an extracted cascode stage.

The compensated distributed-balun output network 250, as depicted and further discussed with respect to FIGS. 4-9B, can include a distributed balun. For example, compensated distributed-balun output network 250 can include coupled transmission lines. The compensated distributed-balun output network 250 can include two coupled lines, a capacitor ($C_L$) at the secondary winding, and respective capacitors ($C_{dev}$) at the primary windings. As will be appreciated such a design is configured to absorb the device output capacitances. Additionally, compensated distributed-balun output network 250 can include a compensation line connected between the two coupled transmission lines. As will be appreciated, such a design will reduce impedance imbalances across different ports of the compensated distributed-balun output network 250.

Figure 3:
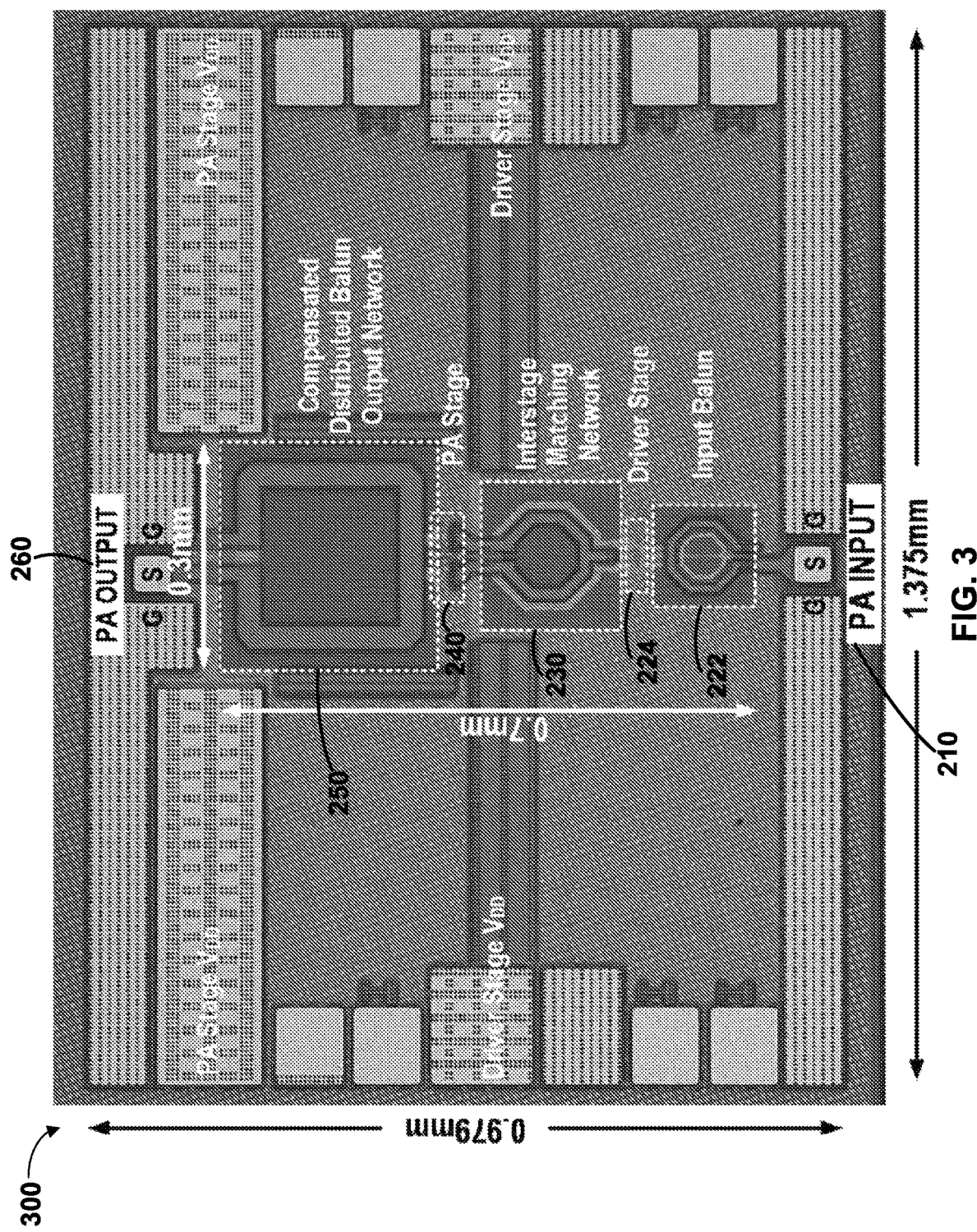
FIG. 3 is a chip layout of a broadband power amplifier, in accordance with an example of the present disclosure.

FIG. 3 is a layout of a chip 300 that includes a broadband power amplifier 200, in accordance with an example of the present disclosure. Chip 300 may be a chip in a 45 nm CMOS SOI process with the broadband power amplifier 200 architecture implemented on it. As will be appreciated by those will skill in the art, the chip 300 may be a chip formed from other materials and in other manufacturing processes. As shown, the chip 300 may include features that correspond to the features shown in FIG. 2. For example, chip 300 may include an input network 220, an interstage matching network 230, a power amplification stage 240, and a compensated distributed-balun output network 250.

As further depicted, the input network 220 can include an input balun 222 and a driver stage 224. The input balun 222 can match the input impedance to the impedance of the device that provides the input signal 210 and send an impedance matched signal to the driver stage 224. The driver stage 224 can amplify the signal from the input balun 222 and send a first amplified signal to the interstage matching network 230. The interstage matching network 230 can match the impedance of the first amplified signal and send an impedance matched signal to the power amplification stage 240 that can generate a second amplified signal. As depicted, the power amplification stage 240 can include cascode power amplification stage and a common-source driver stage. Further, neutralization capacitors can be included at both cascode power amplification stage and a common-source driver stage. As will be appreciated such a design provides for enhanced stability and power gain. Additionally, resistors can be added to the gates of the cascode power amplification stage and a common-source driver stage for broadband matching. The compensated distributed-balun output network 250 can match the output impedance of the power amplification stage 240 and produce an output signal 260. Because the broadband power amplifier 200 may be fitted onto a chip 300 that may be, for example but not limited to, a rectangular chip that is 1.375 mm by 0.979 mm in size, the chip or chips 300 may be well-suited for use in cell phones, base stations, radar equipment used in vehicles, and other communication devices used in various wireless communication systems, such as 5G communication.

Figure 4:
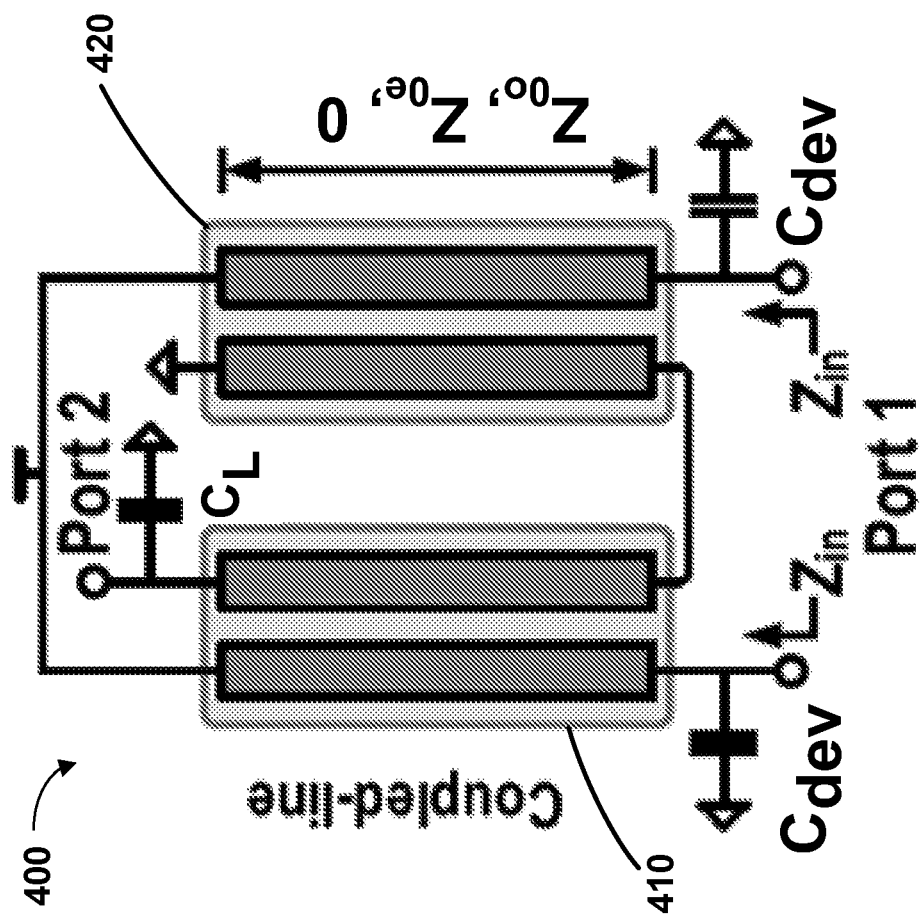
FIG. 4 is a line-based model of the example output network of FIG. 4, in accordance with an example of the present disclosure.
Figure 5:
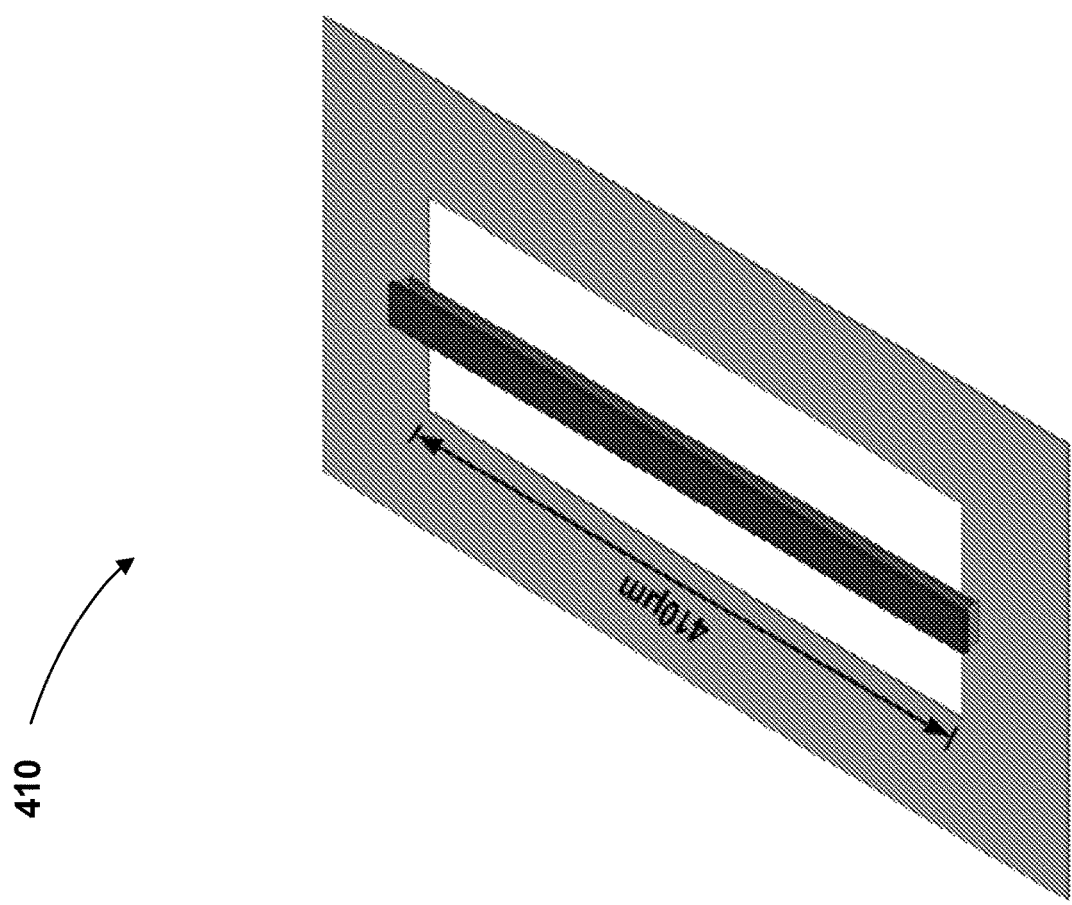
FIG. 5 depicts a block diagram of an example coupled-line of a proposed output network FIG. 4, in accordance with an example of the present disclosure.
Figure 6:
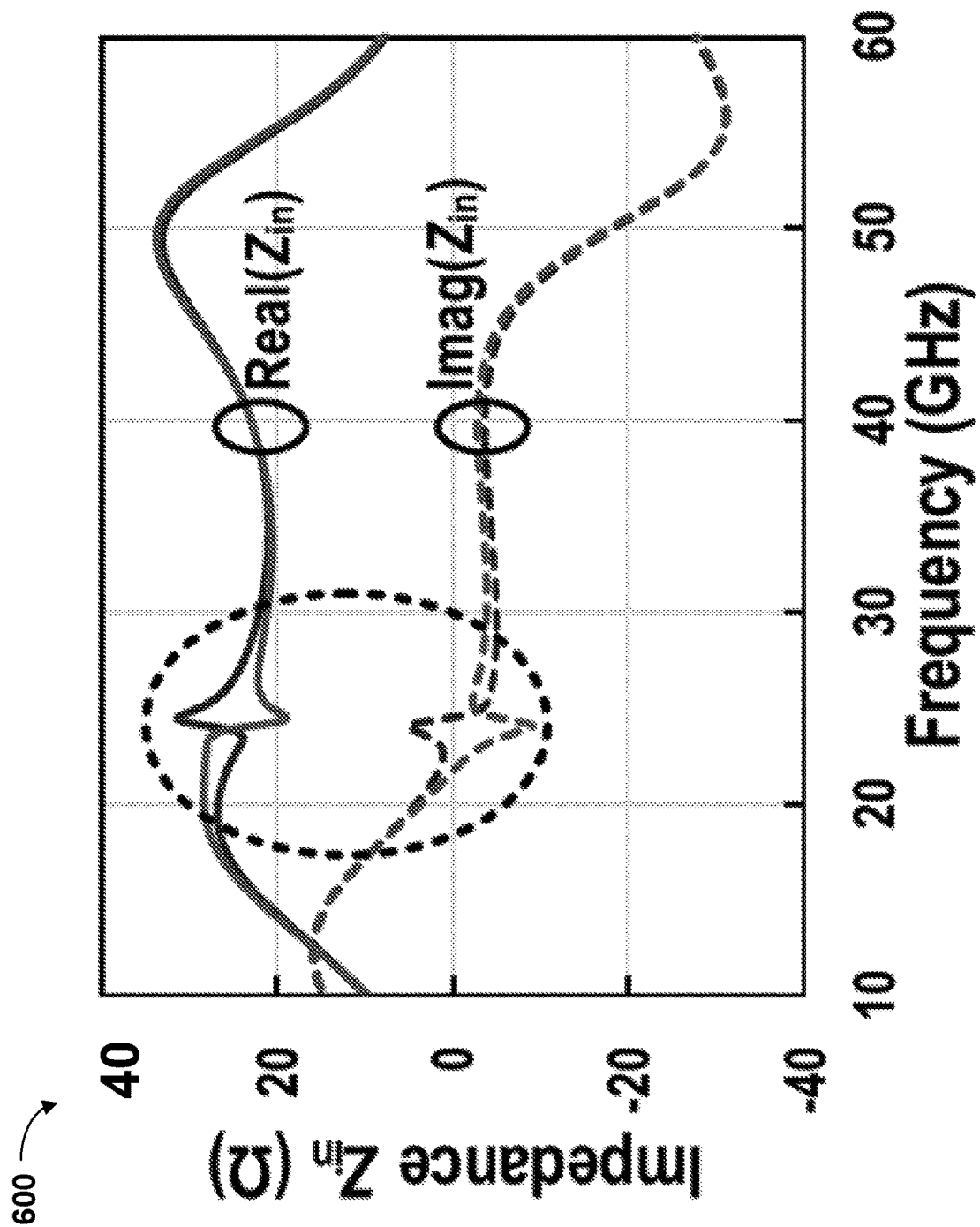
FIG. 6 is a chart depicting impedance versus frequency for the example output network of FIG. 4, in accordance with an example of the present disclosure.

FIG. 4 depicts a block diagram of an example output network 400 of a broadband power amplifier 200, in accordance with an example of the present disclosure. As shown, the output network 400 can include a distributed balun having a first coupled transmission line section 410 and a second coupled transmission line section 420. The output network 400 can be realized by meandering a first coupled transmission line section 410 and second coupled transmission line section 420. As depicted, output network 400 can include two coupled lines, a capacitor ($C_L$) at the secondary winding, and respective capacitors ($C_{dev}$) at the primary windings. Further, FIG. 5 is a line-based model of coupled transmission line 410, 420 of the example output network 400, in accordance with an example of the present disclosure. As will be appreciated such a design is configured to absorb the device output capacitances. FIG. 6 is a chart 600 depicting impedance versus frequency for the example output network 400, in accordance with an example of the present disclosure. As shown in chart 600, the simulation of the output network 400 demonstrates that the exists an impedance imbalance due at the differential port around 25 GHz.

Figure 7:
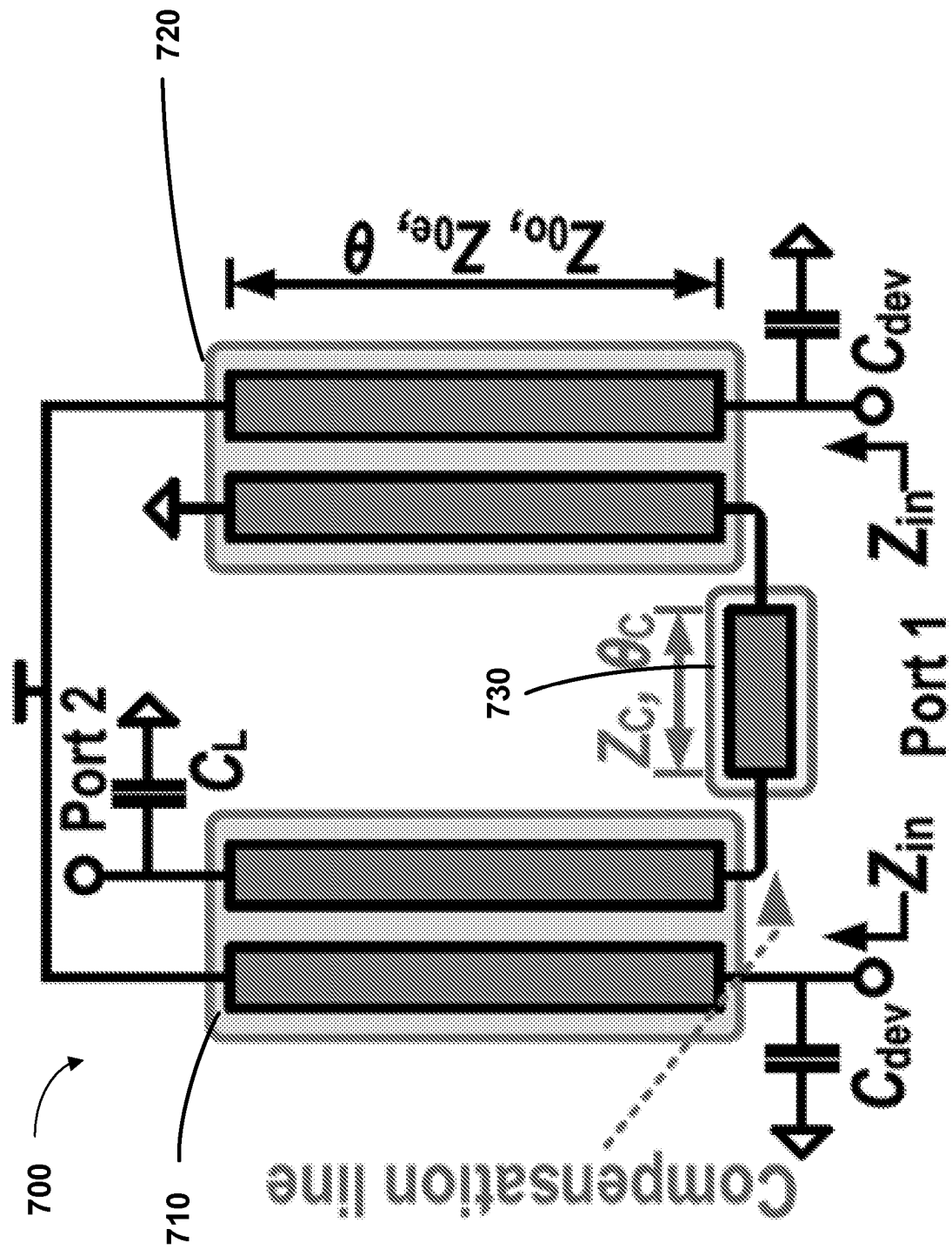
FIG. 7 is a line-based model of the example output network of FIG. 7C, in accordance with an example of the present disclosure.

FIG. 7 is a line-based model of the example output network 700, in accordance with an example of the present disclosure. As shown, the output network 700 can include a distributed balun having a first coupled transmission line section 710 and a second coupled transmission line section 720. As further depicted, output network 700 can include a capacitor ($C_L$) at the secondary winding, and respective capacitors ($C_{dev}$) at the primary windings. As will be appreciated such a design is configured to absorb the device output capacitances. FIGS. 8A-8C depicts a block diagram of the design process 800 of example output network 700 of a broadband power amplifier, in accordance with an example of the present disclosure. As shown, the output network 700 can include a distributed balun having a first coupled transmission line section 710, a second coupled transmission line section 720, and a compensation line 730. The output network 700 can be realized by meandering a first coupled transmission line section 710 and second coupled transmission line section 720 and merging it with compensation line 730, as depicted in FIG. 7C.

Figures 9A, 9B:
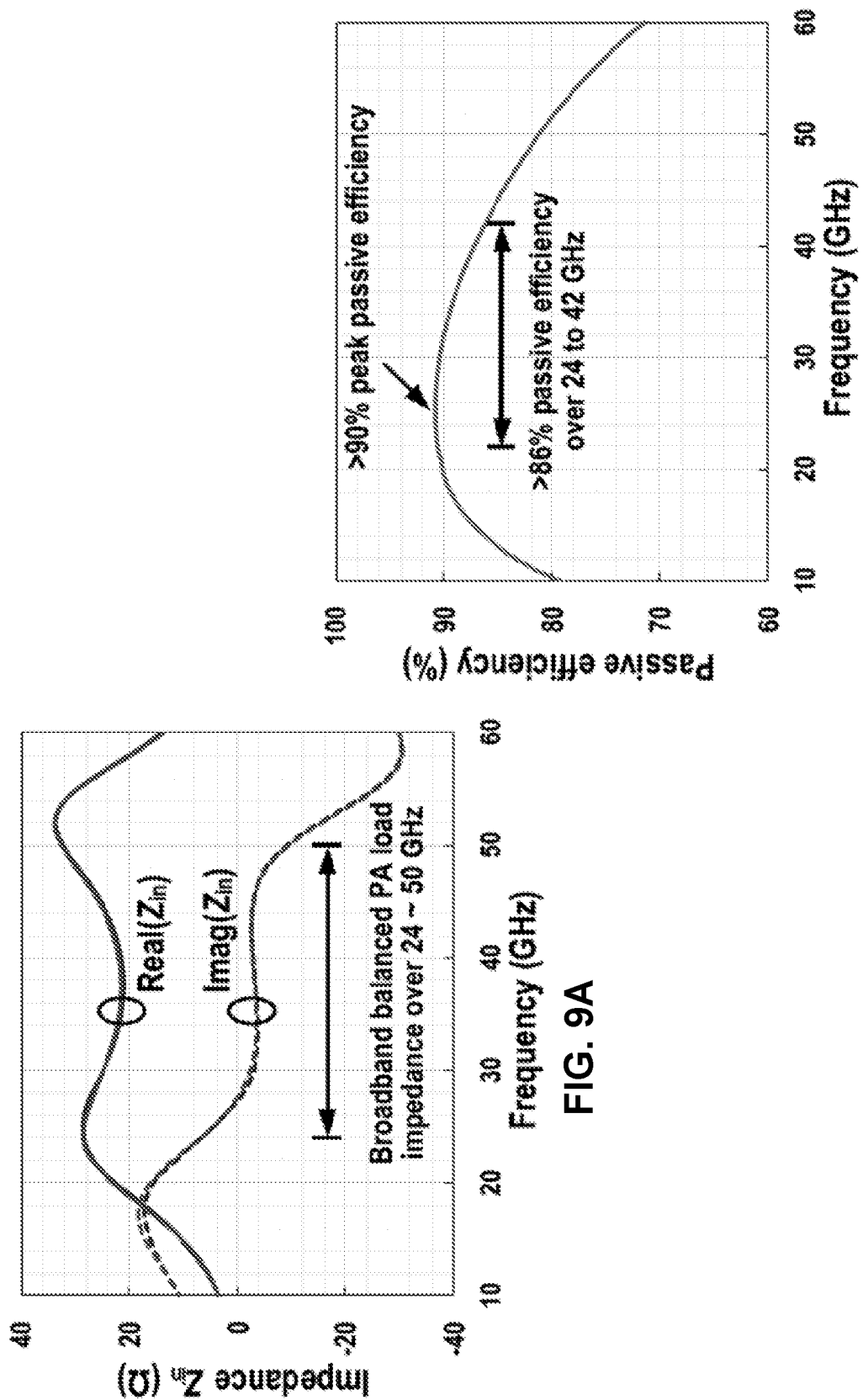
FIG. 9A is a chart depicting impedance versus frequency for the example output network of FIG. 7C, in accordance with an example of the present disclosure.
FIG. 9B is a chart depicting passive efficiency versus frequency for the example output network of FIG. 7C, in accordance with an example of the present disclosure.

FIG. 9A is a chart depicting impedance versus frequency for the example output network 700 of FIG. 7C, in accordance with an example of the present disclosure. As shown in FIG. 9A, the output network 700 demonstrates broadband balance power amplification load impedance over 20 GHz-50 GHz. FIG. 9B is a chart depicting passive efficiency versus frequency for the example output network 700 of FIG. 7C, in accordance with an example of the present disclosure. As shown in FIG. 9B, the output network 700 demonstrates greater than 86% passive efficiency over 20 GHz-50 GHz.

Figure 10A:
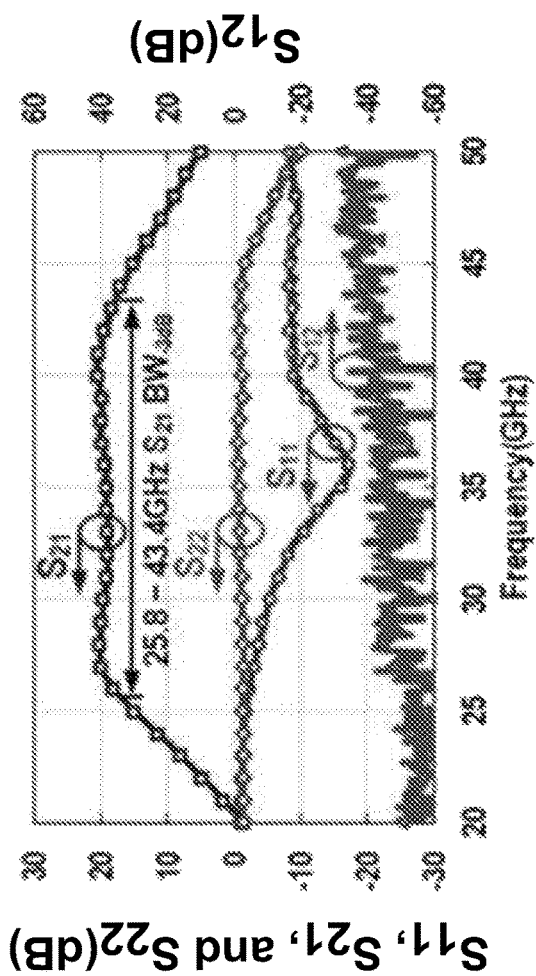
FIG. 10A is a chart depicting the small-signal S-parameters versus frequency for the example broadband amplifier of FIG. 2, in accordance with an example of the present disclosure.
Figure 10B:
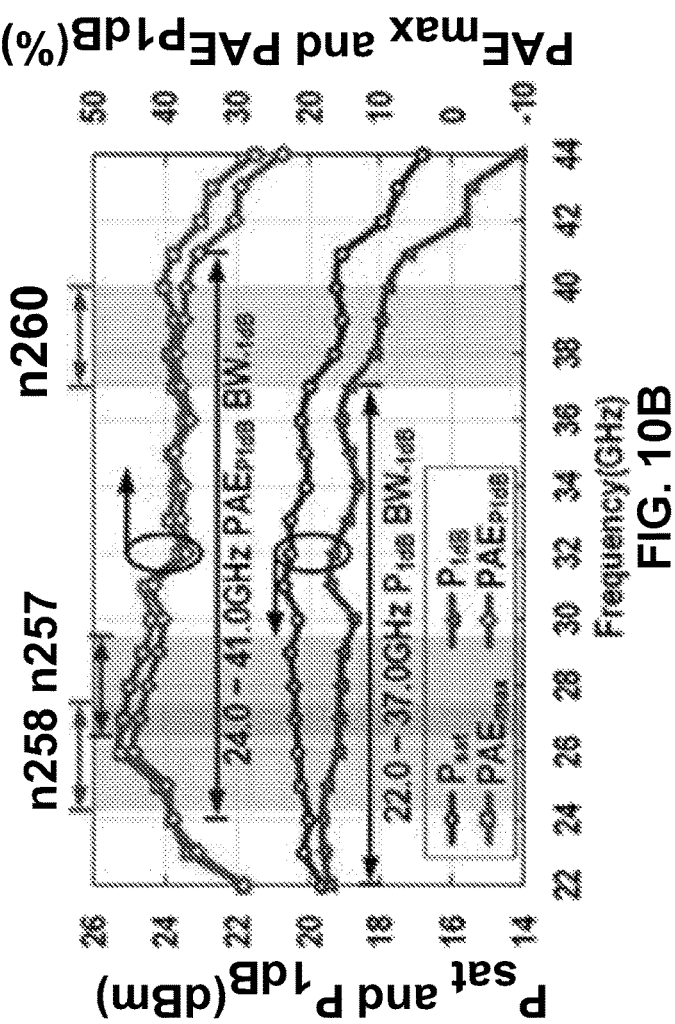
FIG. 10B is a chart depicting the large-signal continuous-wave (CW) performance versus frequency for the example broadband amplifier of FIG. 2, in accordance with an example of the present disclosure.

FIG. 10A is a chart depicting the small-signal S-parameters versus frequency for the example broadband amplifier 200, in accordance with an example of the present disclosure. As depicted, the peak $S_{u}$ is 20.5 dB at 40 GHz with a 3 dB bandwidth over 25.8 to 43.7 GHz. $S_{22}$ is −1.1 dB at 40 GHz. FIG. 10B is a chart depicting the large-signal continuous-wave (CW) performance versus frequency for the example broadband amplifier 200, in accordance with an example of the present disclosure. Specifically, the large-signal continuous wave (CW) results over 22 to 44 GHz are depicted. Over 24 to 40 GHz, the broadband amplifier 200 continuously achieves >19.1 dBm $P_{sat}$ with >37.3% peak PAE (PAE). Further, as depicted, the broadband amplifier 200 demonstrates a very flat $P_{1\,dB}$ of 17.8 to 19.6 dBm, within 1.6 dB from $P_{sat}$, and a very flat $PAE_{P1}$ dB of 36.6 to 44.3% over 24 to 40 GHz. As will be appreciated, such results reinforce the wideband large-signal matching nature of the broadband amplifier 200.

Figure 11B:
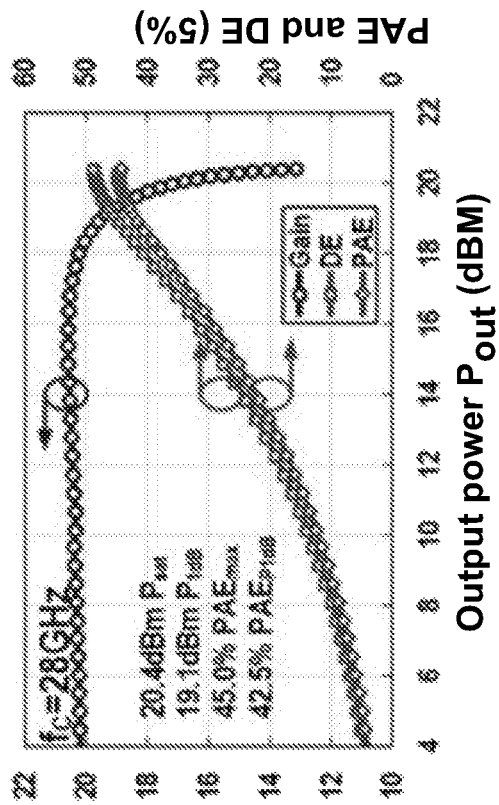
FIGS. 11A-11D are charts depicting power gain and power added efficiency (PAE) versus output power for various frequency bands, in accordance with an example of the present disclosure.
Figure 11D:
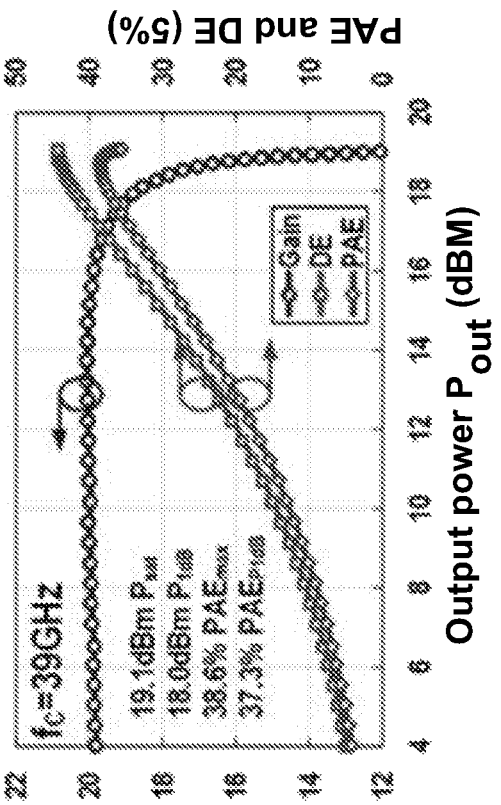
Figure 11A:
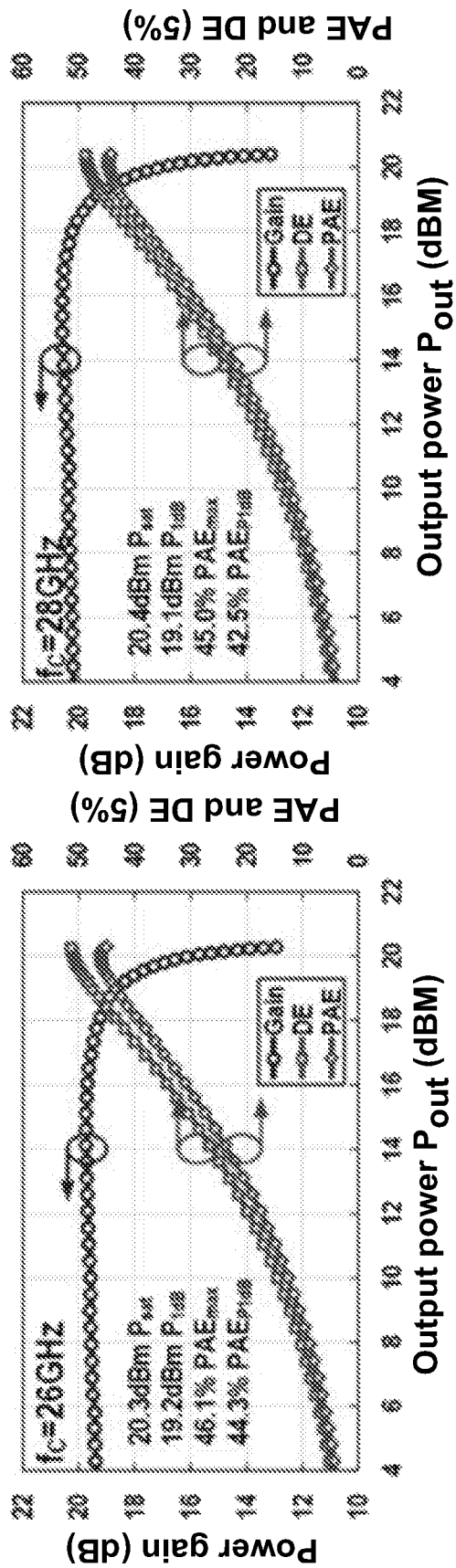
Figure 11C:
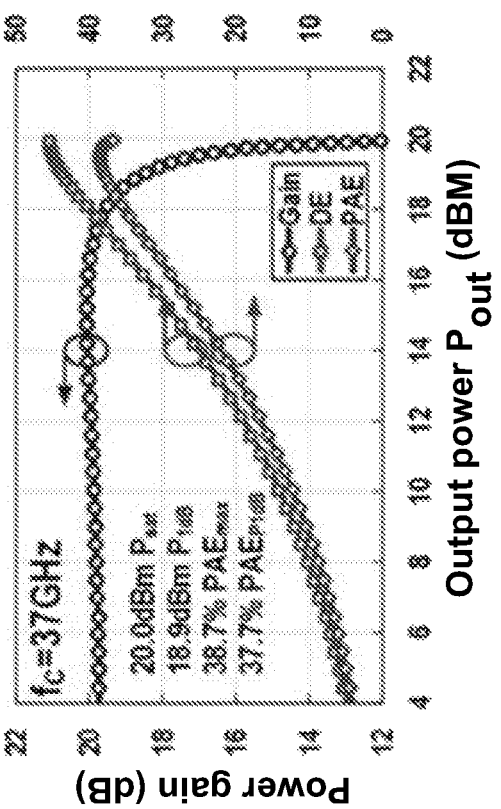

FIGS. 11A-11D are charts depicting power gain and power added efficiency (PAE) versus output power for various frequency bands for the example broadband amplifier 200, in accordance with an example of the present disclosure. FIG. 11A depicts power gain versus output power for the 26 GHz frequency band for the example broadband amplifier 200. As depicted, at 26 GHz, the broadband amplifier 200 achieves 20.3 dBm $P_{sat}$ and 19.2 dBm $P_{1\,dB}$ with a high 46.1% $PAE_{max}$ and 44.3% $PAE_{P1\,dB}$. FIG. 11B depicts power gain versus output power for the 28 GHz frequency band for the example broadband amplifier 200. As depicted, at 28 GHz, the broadband amplifier 200 achieves 20.4 dBm $P_{sat}$ and 19.1 dBm $P_{1\,dB}$ with a high 45% $PAE_{max}$ and 42.5% $PAE_{P1\,dB}$. FIG. 11C depicts power gain versus output power for the 37 GHz frequency band for the example broadband amplifier 200. As depicted, at 37 GHz, the broadband amplifier 200 achieves 20.0 dBm $P_{sat}$ and 18.9 dBm $P_{1\,dB}$ with a high 38.7% $PAE_{max}$ and 37.7% $PAE_{P1\,dB}$. FIG. 11D depicts power gain versus output power for the 39 GHz frequency band for the example broadband amplifier 200. As depicted, at 39 GHz, the broadband amplifier 200 achieves 19.1 dBm $P_{sat}$ and 18.0 dBm $P_{1\,dB}$ with a high 38.6% $PAE_{max}$ and 37.3% $PAE_{P1\,dB}$.

According to some embodiments, one or more broadband power amplifiers 100, 200 of the present disclosure may be utilized in a transmission system. For example, a transmission system can include a broadband power amplifier 200, a radio frequency (RF) transmitter system, and an antenna for transmitting an amplified output signal. According to some embodiments, the transmitter system may generate or output a complex modulated signal that may be processed and amplified by the broadband power amplifier 200 to generate an amplified output signal as described above with respect to FIGS. 1-3.

Figure 12:
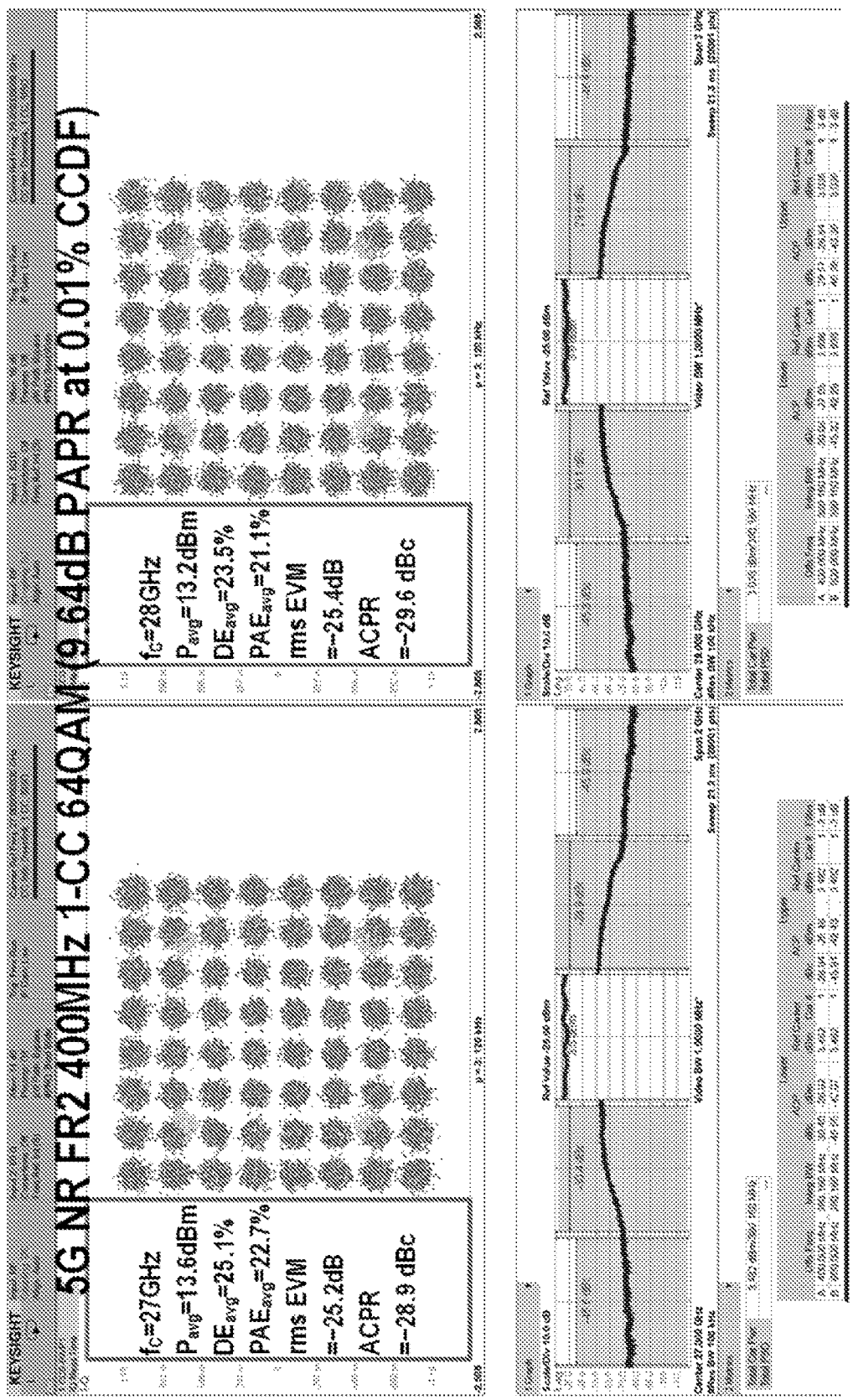
FIG. 12 are charts depicting modulation measurement results with 5G NR FR2 400 MHz 1-CC 64 QAM signals applied to example broadband amplifier of FIG. 2, in accordance with an example of the present disclosure.
Figure 13:
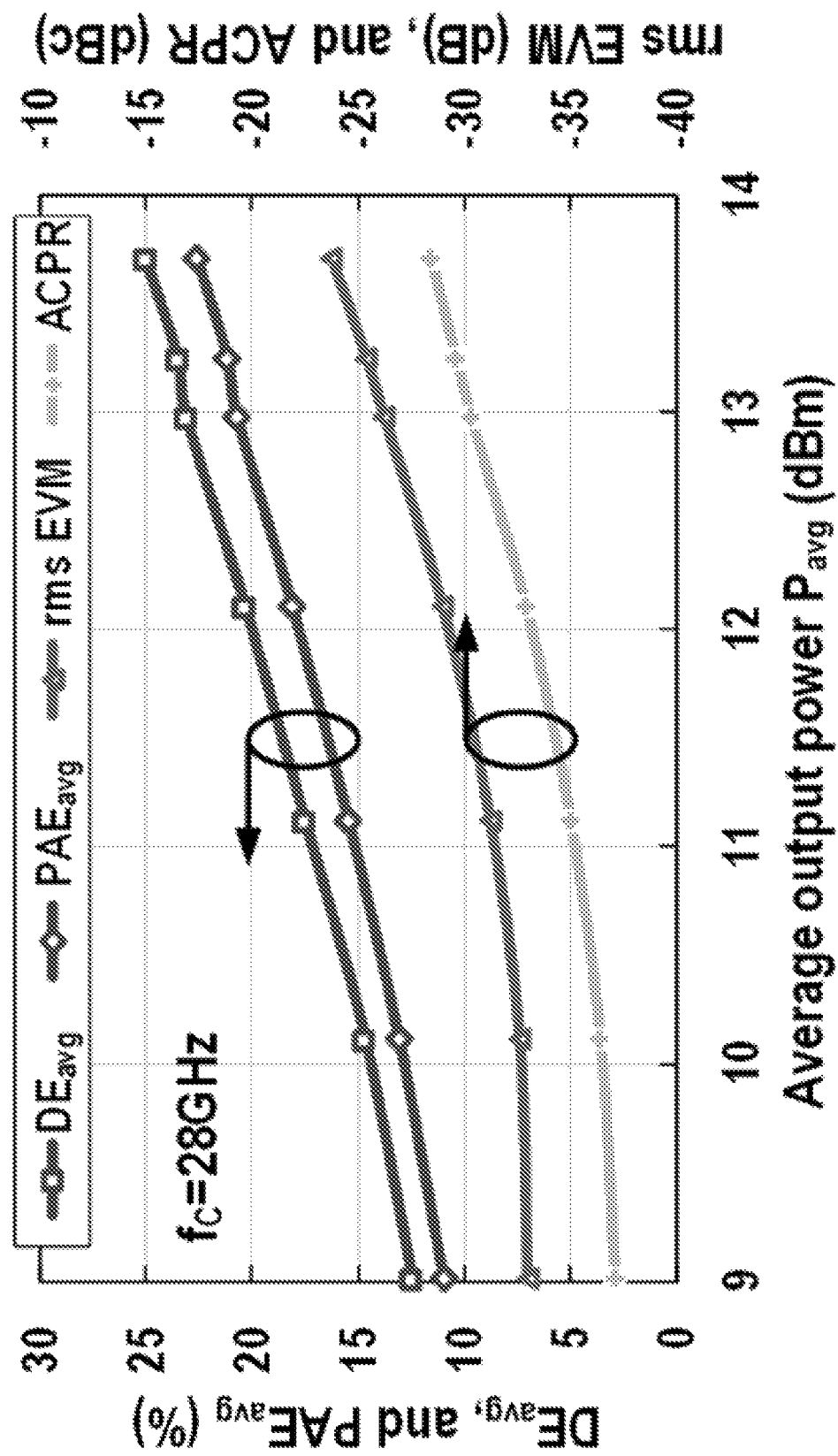
FIG. 13 is a chart depicting a summary of modulation performance results with 5G NR FR2 400 MHz 1-CC 64 QAM signals applied to example broadband amplifier 200 of FIG. 2, in accordance with an example of the present disclosure.
Figure 14:
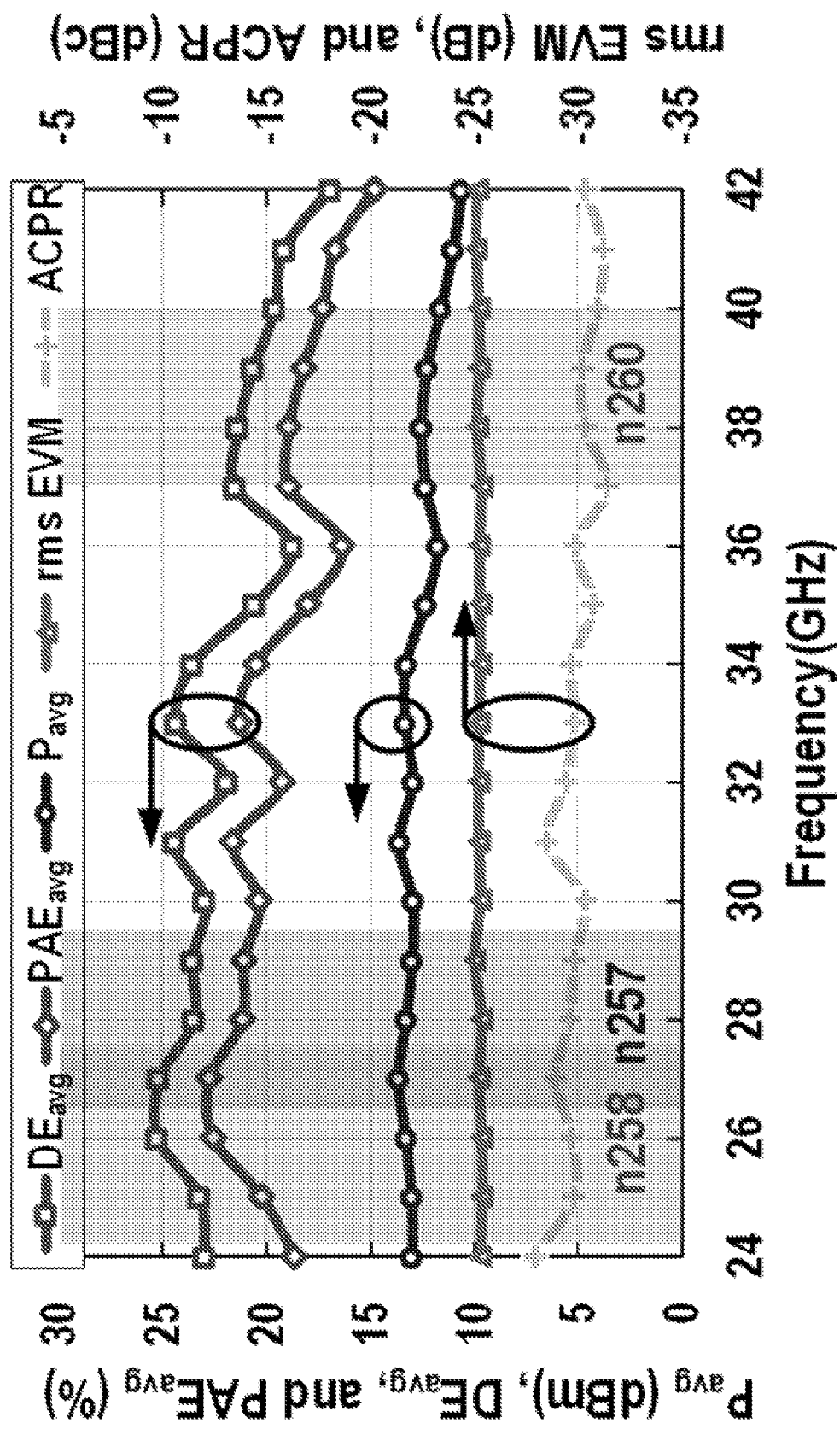
FIG. 14 is a chart depicting a summary of modulation performance results with 5G NR FR2 400 MHz 1-CC 64 QAM signals applied to example broadband amplifier 200 of FIG. 2, in accordance with an example of the present disclosure.

FIG. 12 are charts depicting modulation measurement results with 5G NR FR2 400 MHz 1-CC 64 QAM signals applied to example broadband amplifier 200 of FIG. 2, in accordance with an example of the present disclosure. The broadband amplifier 200 was tested using FR2 5G NR signals with no DPD over 24 to 42 GHz. For 5G NR FR2 400 MHz 1-CC 64-QAM (9.64 dB PAPR), the measured highest performance is average output power ($P_{avg}$)/average PAE ($PAE_{avg}$) of 13.8 dBm/23.3% with −25.4 rms EVM at 27 GHz. Further depicted is the summary of modulation performance with 5G NR FR2 400 MHz 1-CC 64 QAM versus average output power and versus carrier frequency. FIG. 13 is a chart depicting a summary of modulation performance results with 5G NR FR2 400 MHz 1-CC 64 QAM signals applied to example broadband amplifier 200 of FIG. 2, in accordance with an example of the present disclosure. The chart depicts the summary of modulation performance with 5G NR FR2 800 MHz 2-CC 64 QAM versus average output power. FIG. 14 is a chart depicting a summary of modulation performance results with 5G NR FR2 400 MHz 1-CC 64 QAM signals applied to example broadband amplifier 200 of FIG. 2, in accordance with an example of the present disclosure. The chart depicts the summary of modulation performance with 5G NR FR2 800 MHz 2-CC 64 QAM versus carrier frequency.

Figure 15:
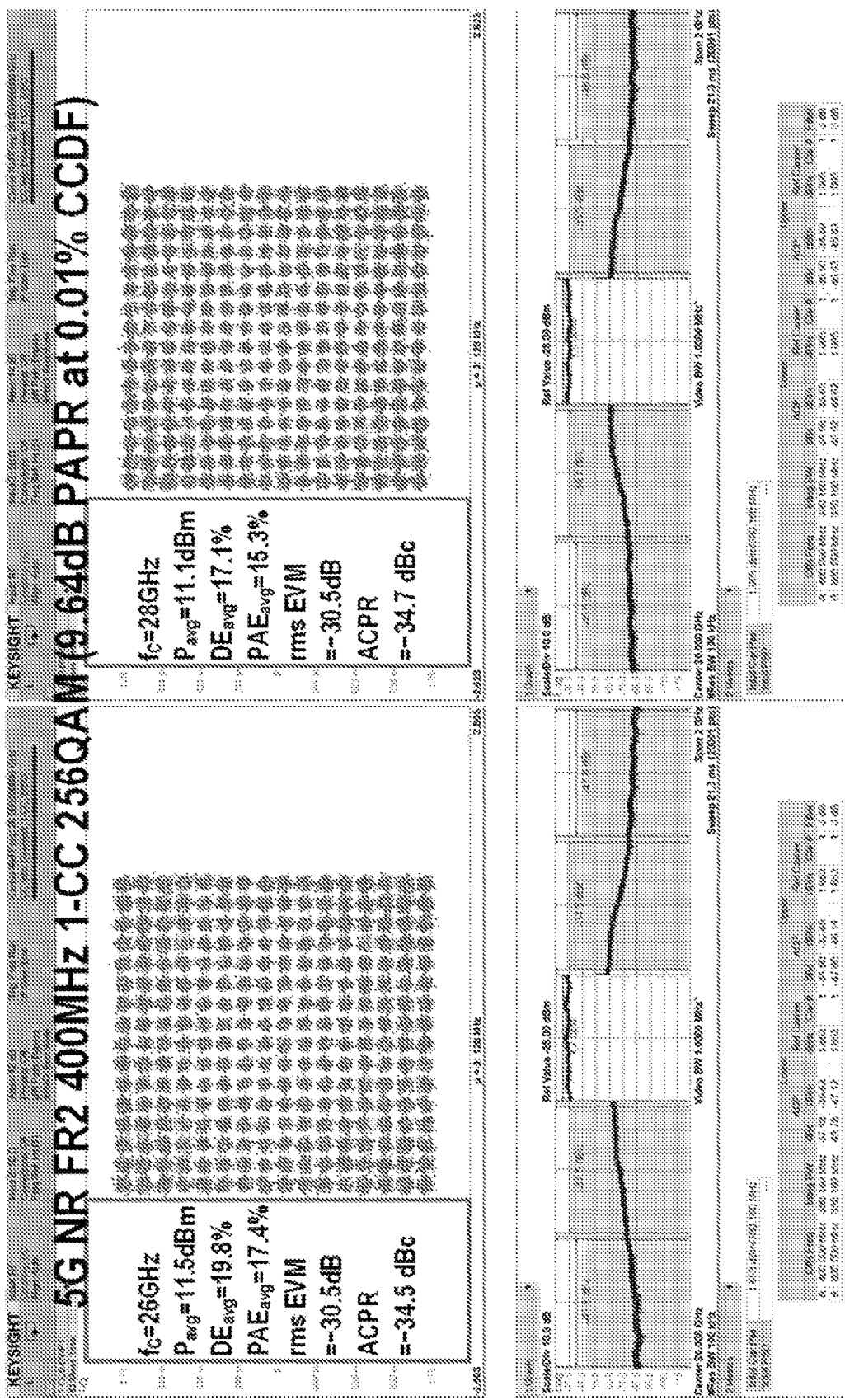
FIG. 15 are charts depicting modulation measurement results with 5G NR FR2 400 MHz 1-CC 256 QAM signals applied to example broadband amplifier 200 of FIG. 2, in accordance with an example of the present disclosure.
Figure 16:
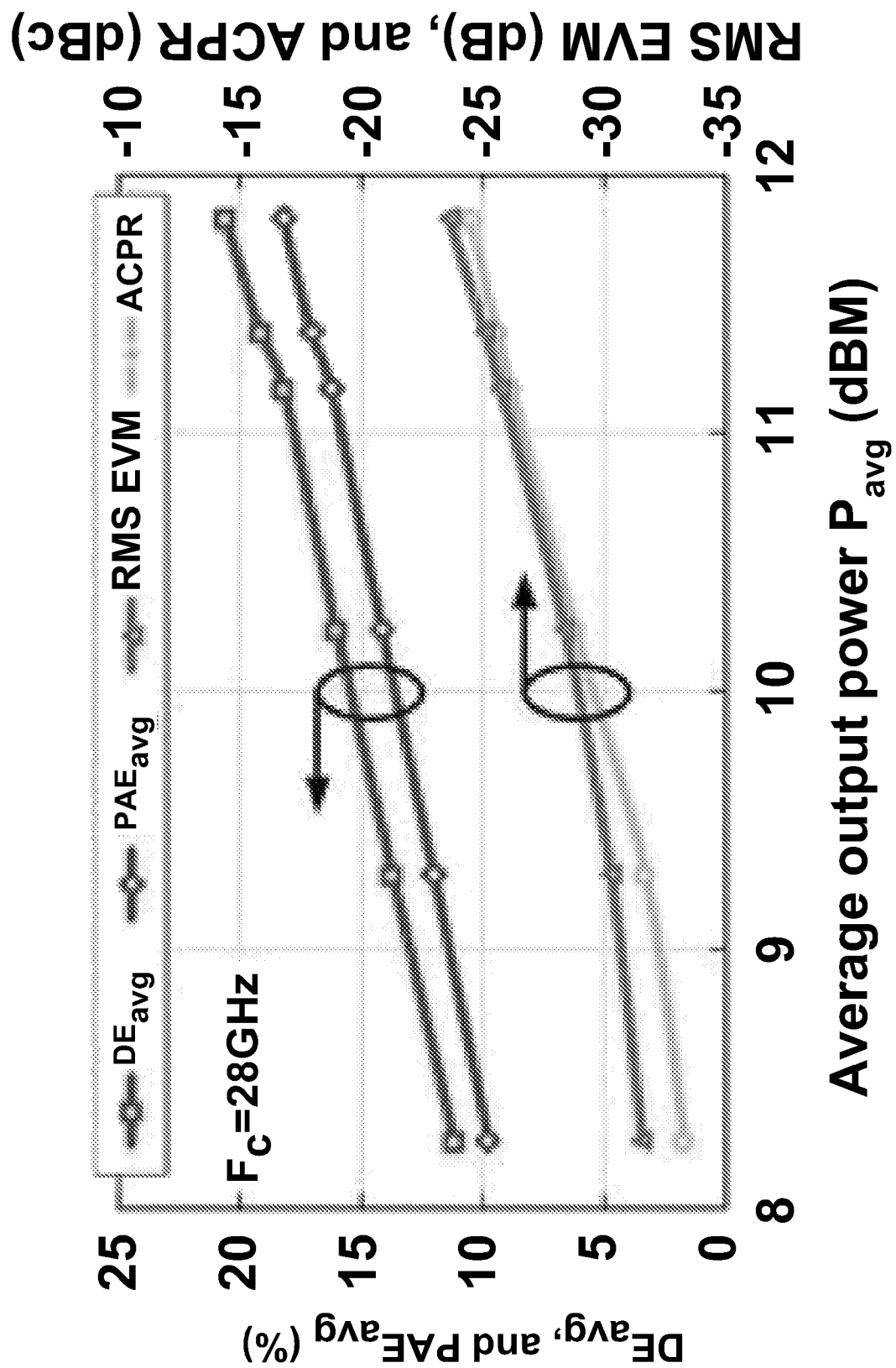
FIG. 16 is a chart depicting a summary of modulation performance results with 5G NR FR2 400 MHz 1-CC 256 QAM signals applied to example broadband amplifier 200 of FIG. 2, in accordance with an example of the present disclosure.
Figure 17:
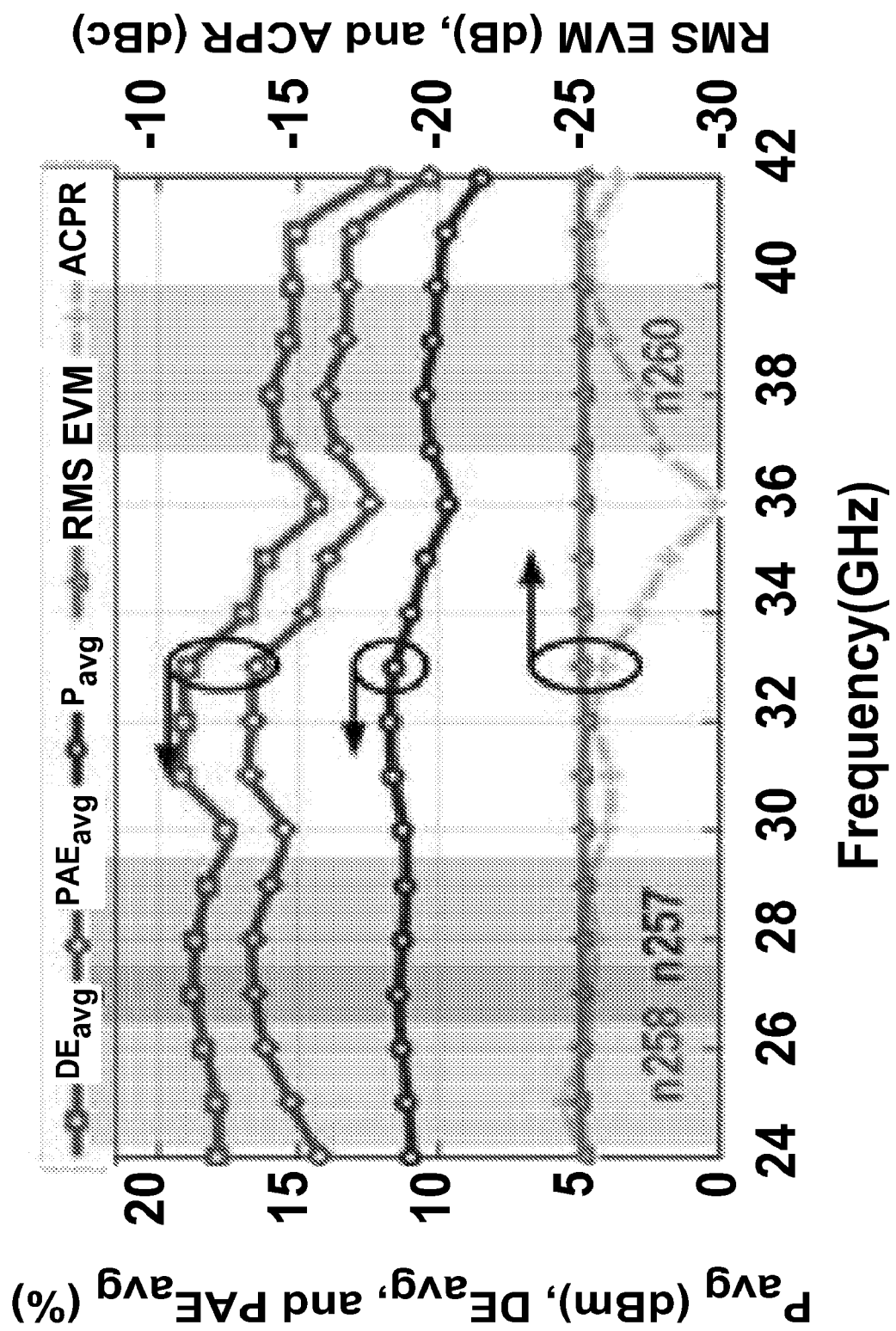
FIG. 17 is a chart depicting a summary of modulation performance results with 5G NR FR2 400 MHz 1-CC 256

FIG. 15 are charts depicting modulation measurement results with 5G NR FR2 400 MHz 1-CC 256 QAM signals applied to example broadband amplifier 200 of FIG. 2, in accordance with an example of the present disclosure. The broadband amplifier 200 was tested using FR2 5G NR signals with no DPD over 24 to 42 GHz. For 5G NR FR2 400 MHz 1-CC 256-QAM (9.64 dB PAPR), the measured highest performance is Pavg/PAEavg of 11.6 dBm/17.8% with −30.5 dB rms EVM at 26 GHz. Further depicted is the summary of modulation performance with 5G NR FR2 400 MHz 1-CC 256 QAM versus average output power and versus carrier frequency. FIG. 16 is a chart depicting a summary of modulation performance results with 5G NR FR2 400 MHz 1-CC 256 QAM signals applied to example broadband amplifier 200 of FIG. 2, in accordance with an example of the present disclosure. The chart depicts the summary of modulation performance with 5G NR FR2 800 MHz 2-CC 256 QAM versus average output power. FIG. 17 is a chart depicting a summary of modulation performance results with 5G NR FR2 400 MHz 1-CC 256 QAM signals applied to example broadband amplifier 200 of FIG. 2, in accordance with an example of the present disclosure. The chart depicts the summary of modulation performance with 5G NR FR2 800 MHz 2-CC 256 QAM versus carrier frequency.

FIG. 18 depicts a block diagram of an example output network of an active load modulation power amplifier 1800 with multiple efficiency peaks at back-off, in accordance with an example of the present disclosure. The active load modulation power amplifier 1800 can include an input network (such as those previously discussed, 120, 220), a hybrid coupler output network 1810, a main power amplification path 1820, and one or more auxiliary power amplification paths 1830,1840. Main power amplification path 1820 and one or more auxiliary power amplification paths 1830,1840 can contain one or more amplifier stages. In some embodiments, main path 1820 and one or more auxiliary paths 1830,1840 can be arranged in parallel and positioned between input network and output network 1810. Main power amplification path 1820 and one or more auxiliary power amplification paths 1830,1840 may perform power amplification processes on their respective input signals and output respective amplified output signals. The hybrid coupler output network 1810 can include a quadrature coupling having a load 1850 connected to the input port and the main power amplification stage 1820, the first auxiliary power amplification stage 1830, and the second auxiliary power amplification stage 1840 connected to the remaining ports.

The input network can be made of passive components such as inductors and capacitors that match the impedance to the driver input impedance and then outputs the signal to the driver stage. The driver stage can be made from power cells/transistors that are configured to amplify the signal and then output the signal to the interstage matching network. The interstage matching network can be made from passive components such as inductors and capacitors that are configured to match the power amplification input impedance to the desired driver load impedance before outputting to one of the power amplification stages 1820, 1830, 1840.

The power amplification stages 1820, 1830, 1840 can be configured to amplify an RF signal and provide an amplified RF signal. The power amplification stages 1820, 1830, 1840 can include any suitable RF power amplifier transistor. For instance, the power amplification stages 1820, 1830, 1840 can be implemented by one or more bipolar transistors, such as one or more SiGe bipolar transistors or one or more GaAs heterojunction bipolar transistors (HBTs). The power amplification stages 1820, 1830, 1840 can be activated and deactivated as desired. For instance, a power amplifier bias signal provided to the power amplification stages 1820, 1830, 1840 can deactivate the power amplification stages 1820, 1830, 1840 when the amplified RF signal provided by the power amplification stages 1820, 1830, 1840 is not being used. Additionally, the power amplification stages 1820, 1830, 1840 can be an extracted cascode stages.

FIG. 19 is a chart depicting the output current versus output power back-off of the active load modulation power amplifier 1800, in accordance with an example of the present disclosure. As will be appreciated, the power amplifiers 1820, 1830, 1840 can be precisely turned on in order to increase the linearity of the amplifier 1800. For example, the power amplifiers 1820, 1830, 1840 can be off until the output power back-off reaches a threshold value, in order to increase the efficiency of the amplifier 1800. As depicted, the main power amplification path 1820 is on and the auxiliary power amplification paths 1830,1840 are off at output power back-off of less than −12 dB. As further depicted, the first auxiliary power amplification stage 1830 begins to turn on at −12 dB PBO and the second auxiliary power amplification stage 1840 begins to turn on at −6 dB PBO. FIG. 20 is a chart depicting the impedance versus output power back-off of the active load modulation power amplifier 1800, in accordance with an example of the present disclosure. FIG. 21 is a chart depicting the efficiency back-off curve of the active load modulation power amplifier 1800, in accordance with an example of the present disclosure. As depicted, active load modulation power amplifier 1800 supports efficiency enhancement at deep power back-off and has efficiency peaks at 6 dB back-off, 12 dB back-off, and 0 dB back-off respectively.

Certain embodiments of the disclosed technology are described above with reference to block and flow diagrams of systems and/or methods according to example embodiments of the disclosed technology. Some blocks of the block diagrams and flow diagrams may not necessarily need to be performed in the order presented, or may not necessarily need to be performed at all, according to some embodiments of the disclosed technology.

While certain embodiments of the disclosed technology have been described in connection with what is presently considered to be the most practical embodiments, it is to be understood that the disclosed technology is not to be limited to the disclosed embodiments, but on the contrary, is intended to cover various modifications and equivalent arrangements included within the scope of the appended claims. Although specific terms are employed herein, they are used in a generic and descriptive sense only and not for purposes of limitation.

This written description uses examples to disclose certain embodiments of the disclosed technology, including the best mode, and also to enable any person skilled in the art to practice certain embodiments of the disclosed technology, including making and using any devices or systems and performing any incorporated methods. The patentable scope of certain embodiments of the disclosed technology is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

We claim:

1. A power amplifier comprising:
 an input network stage connected along an input signal path, the input network stage comprising a driver stage;
 an interstage matching network stage in electrical communication with the driver stage;

a power amplification stage in electrical communication with the interstage matching network stage; and
an output network stage in electrical communication with the power amplification stage;
wherein the output network stage comprises:
a first transmission line;
a second transmission line coupled to the first transmission line; and
a compensation line connected between the first and second transmission lines.

2. The power amplifier of claim 1, wherein the output network stage further comprises:
at least one primary winding;
a secondary winding; and
a first device connected with the secondary winding;
wherein the first device is selected from the group consisting of a transmission line and a capacitor.

3. The power amplifier of claim 1 further comprising:
a first auxiliary power amplification stage in electrical communication with the interstage matching network; and
a second auxiliary power amplification stage in electrical communication with the interstage matching network;
wherein the output network stage is further in electrical communication with the first auxiliary power amplification stage and the second auxiliary power amplification stage; and
wherein the output network stage comprises a quadrature coupling comprising:
an input port connected with a load;
a second port connected to the power amplification stage;
a third port connected to the first auxiliary power amplification stage; and
a fourth port connected to the second auxiliary power amplification stage.

4. The power amplifier of claim 1, wherein the input network stage further comprises an input balun.

5. The power amplifier of claim 1, wherein the power amplifier is configured to provide 24 GHz, 28 GHz, 33 GHz, 37 GHz, 39 GHz, and 42 GHz operations.

6. The power amplifier of claim 1, wherein the power amplifier is configured to provide at least 1 dB power gain bandwidth across a spectrum of 24 GHz to 42 GHz.

7. The power amplifier of claim 1, wherein the power amplification stage comprises a cascode power amplification stage.

8. The power amplifier of claim 7, wherein the power amplification stage further comprises a common-source driver stage.

9. The power amplifier of claim 1, wherein the first and second transmission lines are meandered and merged with the compensation line.

10. The power amplifier of claim 1, wherein the power amplifier is configured as an active load modulation power amplifier; and
wherein the output network stage is configured as a hybrid coupler output network stage.

11. The active load modulation power amplifier of claim 10, wherein the active load modulation power amplifier has efficiency peaks at 0 dB back-off, 6 dB back-off, and 12 dB back-off.

12. The active load modulation power amplifier of claim 10 further comprising:
a first auxiliary power amplification stage in electrical communication with the interstage matching network; and
a second auxiliary power amplification stage in electrical communication with the interstage matching network;
wherein the output network stage is further in electrical communication with the first auxiliary power amplification stage and the second auxiliary power amplification stage; and
wherein the first auxiliary power amplification stage turns on at −12 dB back-off.

13. The active load modulation power amplifier of claim 12, wherein the second auxiliary power amplification stage turns on at −6 dB back-off.

14. A mm-wave power amplifier comprising:
an input network stage connected along an input signal path, the input network comprising a driver stage;
an interstage matching network stage in electrical communication with the driver stage;
a power amplification stage in electrical communication with the interstage matching network; and
a broadband matching output network stage in electrical communication with the power amplification stage;
wherein the broadband matching output network stage has inductive coupling and capacitive coupling, and comprises:
a first transmission line;
a second transmission line coupled to the first transmission line; and
a compensation line connected between the first and second transmission lines; and
wherein the mm-wave power amplifier is fabricated as a 45 nm silicon-on-insulator complementary metal-oxide-semiconductor.

15. The mm-wave power amplifier of claim 14, further comprising
a first auxiliary power amplification stage in electrical communication with the interstage matching network; and
a second auxiliary power amplification stage in electrical communication with the interstage matching network;
wherein the broadband matching output network stage is further in electrical communication with the first auxiliary power amplification stage and the second auxiliary power amplification stage.

16. A transmission system comprising:
a radio transmitter system configured to output a complex modulated signal;
a power amplifier configured as an mm-wave power amplifier for receiving the complex modulated signal and outputting an amplified output signal; and
an antenna for transmitting the amplified output signal;
wherein the mm-wave power amplifier comprises:
an input network stage connected along an input signal path, the input network stage comprising a driver stage;
an interstage matching network stage in electrical communication with the driver stage;
a power amplification stage in electrical communication with the interstage matching network stage; and
an output network stage in electrical communication with the power amplification stage; and
wherein the output network stage of the mm-wave power amplifier is a broadband matching output network stage comprising:
a first transmission line;
a second transmission line coupled to the first transmission line; and
a compensation line connected between the first and second transmission lines.

17. The transmission system of claim 16, wherein the broadband matching output network stage further comprises:
- at least one primary winding;
- a secondary winding; and
- a first capacitor connected with the secondary winding.

18. The transmission system of claim 16, wherein the mm-wave power amplifier is configured to provide 24 GHz, 28 GHz, 33 GHz, 37 GHz, 39 GHz, and 42 GHz operations.

19. The transmission system of claim 16, wherein first and second transmission lines are meandered and merged with the compensation line.

20. A power amplifier comprising:
- an input network stage connected along an input signal path, the input network stage comprising a driver stage;
- an interstage matching network stage in electrical communication with the driver stage;
- a power amplification stage in electrical communication with the interstage matching network stage; and
- an output network stage in electrical communication with the power amplification stage;
- wherein the output network stage comprises:
  - a first transmission line;
  - a second transmission line coupled to the first transmission line;
  - a compensation line connected between the first and second transmission lines;
  - at least one primary winding;
  - a secondary winding; and
  - a first device connected with the secondary winding;
  - wherein the first device is selected from the group consisting of a transmission line and a capacitor.

\* \* \* \* \*